US012588311B2

(12) United States Patent
    Glasscock et al.

(10) Patent No.: US 12,588,311 B2
(45) Date of Patent: Mar. 24, 2026

(54) FLEXIBLE SUBSTRATES HAVING SEMICONDUCTOR PACKAGES

(71) Applicant: TEXAS INSTRUMENTS INCORPORATED, Dallas, TX (US)

(72) Inventors: Bradley Andrew Glasscock, Forney, TX (US); Nagesh Surendranath, Frisco, TX (US); Shriram Devi, Pune (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 590 days.

(21) Appl. No.: 17/491,397

(22) Filed: Sep. 30, 2021

(65) Prior Publication Data

US 2022/0399388 A1    Dec. 15, 2022

Related U.S. Application Data

(60) Provisional application No. 63/209,345, filed on Jun. 10, 2021.

(51) Int. Cl.
    *H10F 39/18*        (2025.01)
    *H10F 39/00*        (2025.01)

(52) U.S. Cl.
    CPC ......... *H10F 39/809* (2025.01); *H10F 39/189* (2025.01); *H10F 39/804* (2025.01); *H10F 39/811* (2025.01)

(58) Field of Classification Search
    CPC ......... H01L 27/14634; H01L 27/14618; H01L 27/14636; H01L 27/14658;

(Continued)

(56) References Cited

U.S. PATENT DOCUMENTS

| | | | |
|---|---|---|---|
| 2007/0126118 A1* | 6/2007 | Lu | H05K 3/301 |
| | | | 257/702 |
| 2008/0185705 A1* | 8/2008 | Osborn | H01L 23/4985 |
| | | | 257/E23.169 |

(Continued)

*Primary Examiner* — Jacob Y Choi
*Assistant Examiner* — Ashley Nicole Blackwell
(74) *Attorney, Agent, or Firm* — Dawn Jos; Frank D. Cimino

(57)                    ABSTRACT

In examples, an electronic device comprises a semiconductor package including a semiconductor die and a set of conductive members coupled to the semiconductor die, the set of conductive members coupled to a bottom surface of the semiconductor package. The package also includes a conductive terminal coupled to the semiconductor die and exposed to the bottom surface, the set of conductive members extending farther away from the bottom surface of the semiconductor die than the conductive terminal extends from the bottom surface of the semiconductor die. The electronic device includes a flexible substrate having first and second ends opposing each other, the first end having a first conductive terminal coupled to the conductive terminal. The second end has a second conductive terminal adapted to be coupled to an electronic component, the first and second conductive terminals are coupled to each other, and the flexible substrate has a bottom surface that does not extend farther away from the bottom surface of the semiconductor package than the set of conductive members extends from the bottom surface of the semiconductor package.

21 Claims, 29 Drawing Sheets

(58) Field of Classification Search
CPC ..... H01L 23/48–5389; H01L 24/10–17; H10F 39/809; H10F 39/189; H10F 39/804; H10F 39/811
See application file for complete search history.

(56) References Cited

U.S. PATENT DOCUMENTS

| | | | |
|---|---|---|---|
| 2015/0255500 A1* | 9/2015 | Akahoshi | H10F 39/018 |
| | | | 257/434 |
| 2018/0069047 A1* | 3/2018 | Labayen De Inza | H01L 27/14696 |
| 2019/0348459 A1* | 11/2019 | Katkar | H01L 27/1469 |
| 2020/0091215 A1* | 3/2020 | Jang | H10F 39/811 |
| 2021/0296271 A1* | 9/2021 | Jeong | H01L 24/03 |

* cited by examiner

110

110    114    114    112    112

200
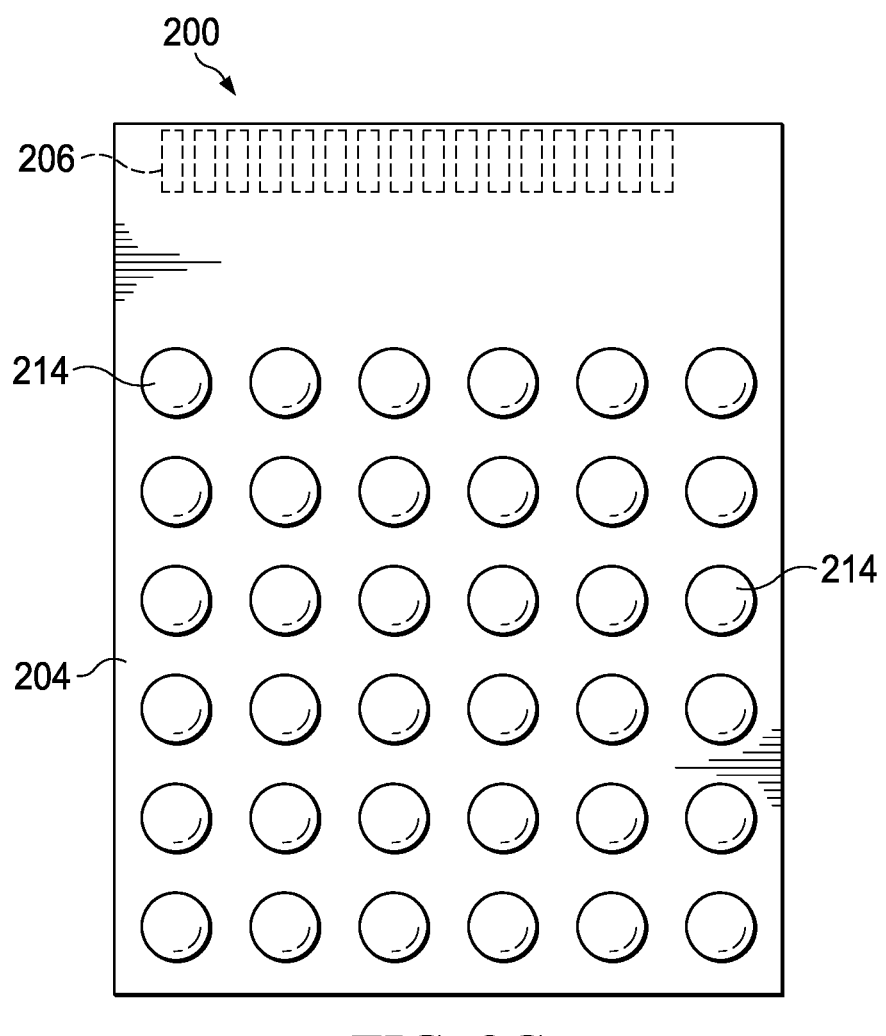
FIG. 2C
200
202
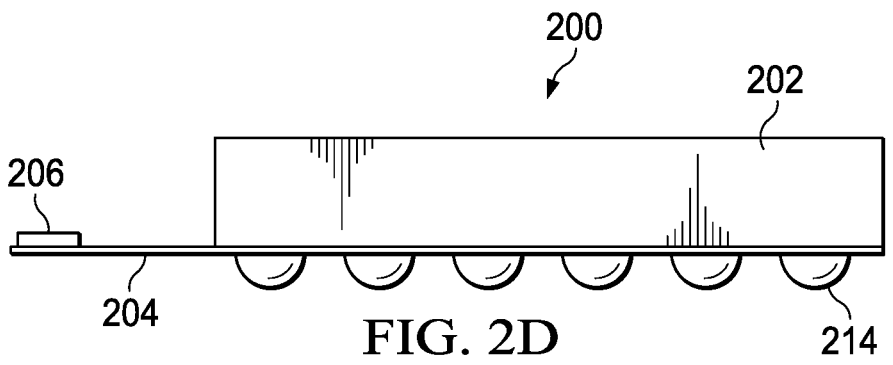
206
204      FIG. 2D      214

230

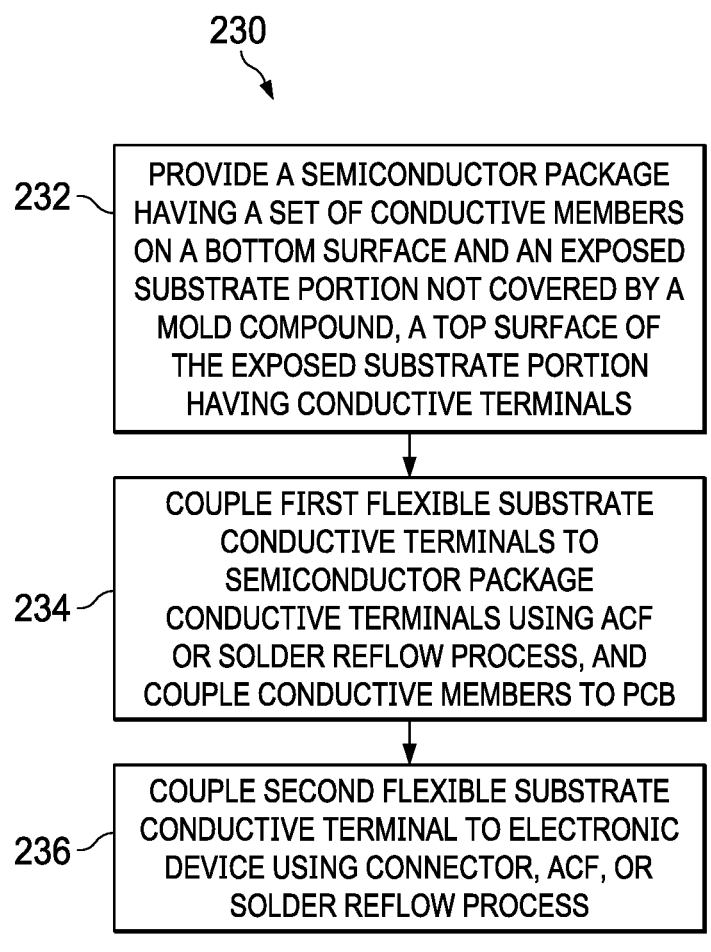

232 — PROVIDE A SEMICONDUCTOR PACKAGE HAVING A SET OF CONDUCTIVE MEMBERS ON A BOTTOM SURFACE AND AN EXPOSED SUBSTRATE PORTION NOT COVERED BY A MOLD COMPOUND, A TOP SURFACE OF THE EXPOSED SUBSTRATE PORTION HAVING CONDUCTIVE TERMINALS

234 — COUPLE FIRST FLEXIBLE SUBSTRATE CONDUCTIVE TERMINALS TO SEMICONDUCTOR PACKAGE CONDUCTIVE TERMINALS USING ACF OR SOLDER REFLOW PROCESS, AND COUPLE CONDUCTIVE MEMBERS TO PCB

236 — COUPLE SECOND FLEXIBLE SUBSTRATE CONDUCTIVE TERMINAL TO ELECTRONIC DEVICE USING CONNECTOR, ACF, OR SOLDER REFLOW PROCESS

332 — PROVIDE SEMICONDUCTOR PACKAGE INCLUDING FLEXIBLE SUBSTRATE HAVING A FIRST PORTION COVERED BY A MOLD COMPOUND AND A SECOND PORTION NOT COVERED BY MOLD COMPOUND

334 — COUPLE CONDUCTIVE MEMBERS ON BOTTOM SURFACE OF SEMICONDUCTOR PACKAGE TO PCB

336 — COUPLE CONDUCTIVE TERMINALS ON PORTION OF FLEXIBLE SUBSTRATE NOT COVERED BY MOLD COMPOUND TO ELECTRONIC DEVICE

FLEXIBLE SUBSTRATES HAVING SEMICONDUCTOR PACKAGES

CROSS-REFERENCE TO RELATED APPLICATIONS

The present application claims priority to U.S. Provisional Patent Application No. 63/209,345, which was filed Jun. 10, 2021, is titled "Design And Method Of Combining BGA And Flex Substrates," and is hereby incorporated herein by reference in its entirety.

BACKGROUND

Some electronic devices are configured to capture images. For example, in the healthcare context, digital x-ray machines capture images from within the animal or human body to aid in the diagnosis of an illness or injury. Some such electronic devices include pixel arrays and integrated circuits that are configured to generate digital signals representing information captured by the pixel arrays (e.g., x-ray images). The pixel arrays and the integrated circuits are coupled to each other by way of a printed circuit board (PCB). PCBs are also frequently useful in other applications to couple multiple electronic devices to each other.

SUMMARY

In examples, an electronic device comprises a semiconductor package including a semiconductor die and a set of conductive members coupled to the semiconductor die, the set of conductive members coupled to a bottom surface of the semiconductor package. The package also includes a conductive terminal coupled to the semiconductor die and exposed to the bottom surface, the set of conductive members extending farther away from the bottom surface of the semiconductor die than the conductive terminal extends from the bottom surface of the semiconductor die. The electronic device includes a flexible substrate having first and second ends opposing each other, the first end having a first conductive terminal coupled to the conductive terminal. The second end has a second conductive terminal adapted to be coupled to an electronic component, the first and second conductive terminals are coupled to each other, and the flexible substrate has a bottom surface that does not extend farther away from the bottom surface of the semiconductor package than the set of conductive members extends from the bottom surface of the semiconductor package.

BRIEF DESCRIPTION OF THE DRAWINGS

For a detailed description of various examples, reference will now be made to the accompanying drawings in which:

FIG. 2C is a bottom-up view of a semiconductor package having a substrate, at least part of which is not covered by a mold compound, in accordance with various examples.

FIG. 2D is a profile view of a semiconductor package having a substrate, at least part of which is not covered by a mold compound, in accordance with various examples.

FIG. 2N is a flow diagram of a method for manufacturing a flexible substrate coupled to a semiconductor package, in accordance with various examples.

DETAILED DESCRIPTION

Figure 1A:
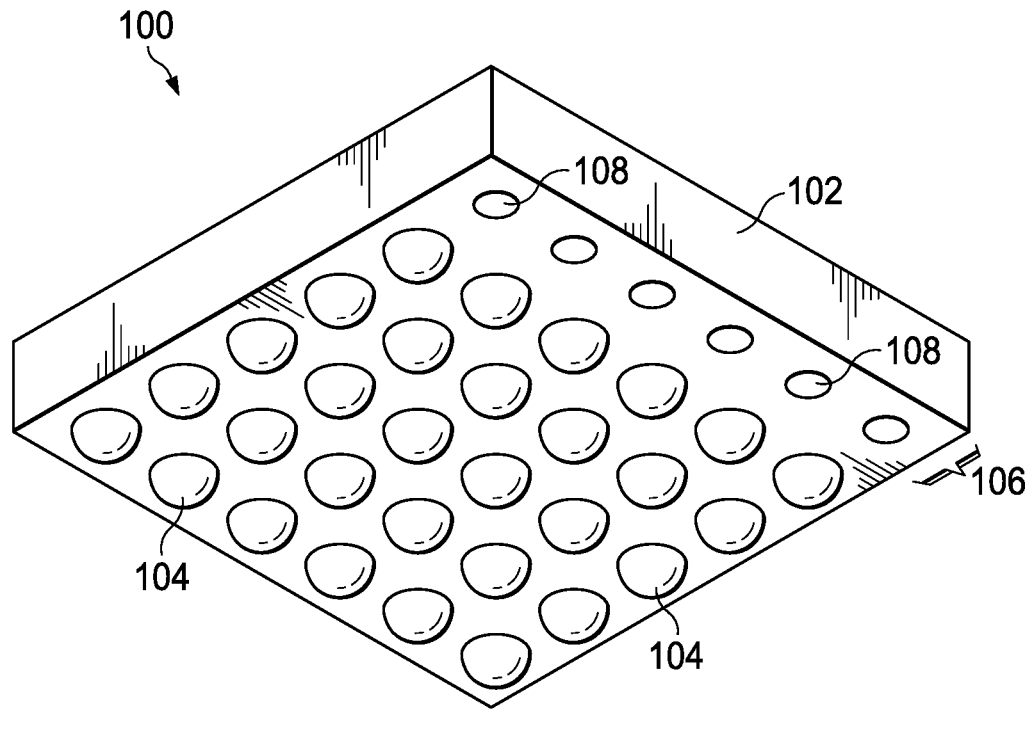
FIG. 1A is a perspective bottom view of a semiconductor package, in accordance with various examples.

As described above, printed circuit boards (PCBs) are frequently useful to couple multiple electronic devices to each other. For example, in the healthcare context, and more specifically in the medical imaging (e.g., digital x-ray) context, PCBs are useful to couple pixel arrays to integrated circuits that are configured to digitize images captured by the pixel arrays. PCBs are also useful for similar reasons in a variety of other contexts and applications. However, PCBs have specific limitations, one of which is the density of conductive traces on the PCB. Exceeding a threshold conductive trace density on a PCB can have negative consequences on the functional integrity of an electronic device. In applications such as digital x-ray imaging, high conductive trace density is necessary, such as to connect the outputs of pixel arrays to the inputs of integrated circuits useful to digitize images captured by the pixel arrays. Thus, the application calls for a level of PCB conductive trace density that is unacceptable from a PCB layout perspective and that cannot be satisfied without jeopardizing the functional integrity of the electronic device.

Flexible substrates have been used as a substitute for PCBs to establish connections between different components of an electronic device, at least in part because the flexible substrates do not have the same restrictive conductive trace density limitations that PCBs have. However, flexible substrates typically use special connectors, such as zero insertion force (ZIF) connectors, that are highly application-specific, thus necessitating frequent and expensive re-designs of the flexible substrates. In addition, such re-designs of the flexible substrates to accommodate evolving ZIF connectors also introduces expensive and tedious changes in manufacturing processes, for example, frequent re-tooling of manufacturing equipment. ZIF connectors are unreliable and prone to becoming loose, and ZIF connector parts are expensive as well.

This disclosure describes various examples of an electronic device that substitutes flexible substrates for PCBs to establish connections between different components of the electronic device, and that further uses semiconductor packages, such as ball grid array (BGA) packages, in lieu of ZIF connector mechanisms. In examples, a flexible substrate includes opposing ends, each having one or more conductive terminals. The conductive terminals on one end of the flexible substrate may be coupled to a component, such as a pixel array of a digital x-ray device. The conductive terminals on the opposite end of the flexible substrate are coupled to a semiconductor package, such as a BGA package. A bottom surface of the BGA package includes one or more conductive pads or terminals coupled to the conductive terminals on a respective end of the flexible substrate. The bottom surface of the BGA package also includes a BGA composed of a set of conductive members (e.g., conductive balls). These conductive members may be coupled to a PCB without using a ZIF or similar connector, thereby mitigating the aforementioned expense, tedium, and unreliability associated with constantly evolving ZIF designs.

FIG. 1A is a perspective bottom view of a semiconductor package 100, in accordance with various examples. In some examples, the semiconductor package 100 is a ball grid array (BGA) package having a plurality of conductive members (e.g., conductive balls) on a bottom surface of the semiconductor package 100, as shown in FIG. 1A. The remainder of this description assumes the use of a BGA package. However, the scope of this disclosure is not limited to any particular type of package. For example, the semiconductor package 100 may be any suitable type of package that includes conductive terminals or members on a bottom and/or side surface of the package, such as quad flat no lead (QFN) package, land grid array (LGA) packages, etc.

Figure 1B:
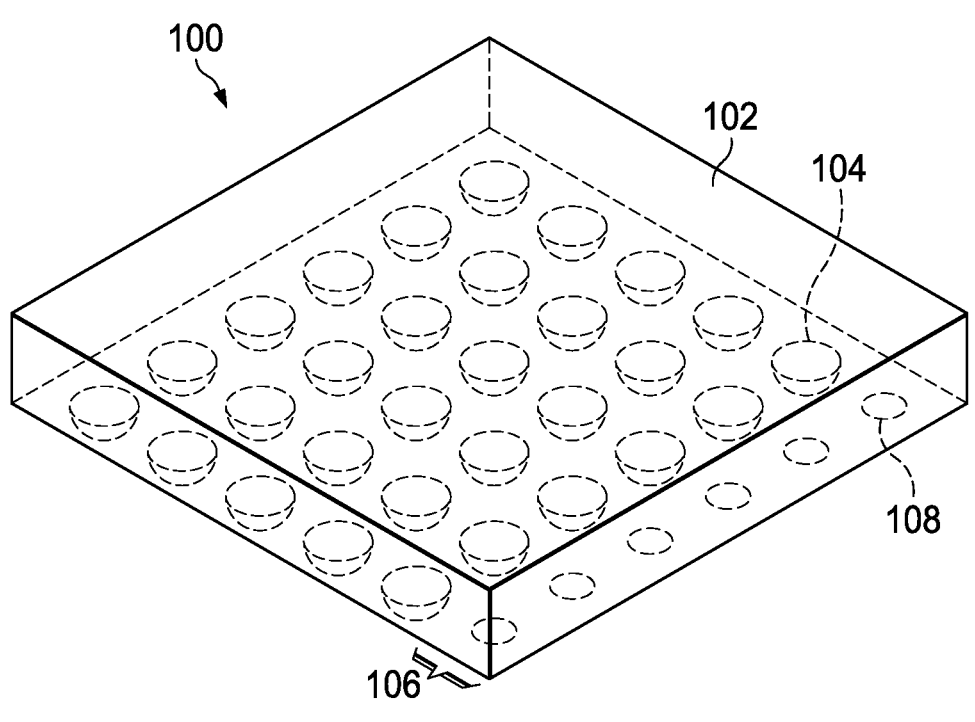
FIG. 1B is a perspective top view of a semiconductor package, in accordance with various examples.

The semiconductor package 100 includes a mold compound 102 that covers a semiconductor die (not expressly shown) within the package 100. The semiconductor die within the package 100 is coupled to the set of conductive members 104, which together constitute a BGA. The package 100 further includes a row 106 of conductive terminals 108. The conductive terminals 108 may be exposed areas of a conductive trace within a substrate of the package 100 on which no conductive members 104 were formed. Although a complete row 106 of conductive terminals 108 is shown, in examples, fewer or more conductive terminals 108 may be provided. FIG. 1B is a perspective top view of the package 100, in accordance with various examples.

The conductive terminals 108 in the row 106 have a high density, meaning the conductive terminals 108 in the row 106 have a pitch that ranges between 25 microns and 150 microns. The solutions described herein are especially useful when the PCB trace density requirements are unacceptably high, and thus the pitch of the conductive terminals 108 in the row 106 will be low. Further, to accommodate such a low pitch, the shapes and/or sizes of the conductive terminals 108 in the row 106 are specifically configured to be rectangular in shape and to have lengths that reliably produce low contact resistance from the bonding that occurs with the conductive terminals 108 when connections to the conductive terminals 108 are established.

Figure 1C:
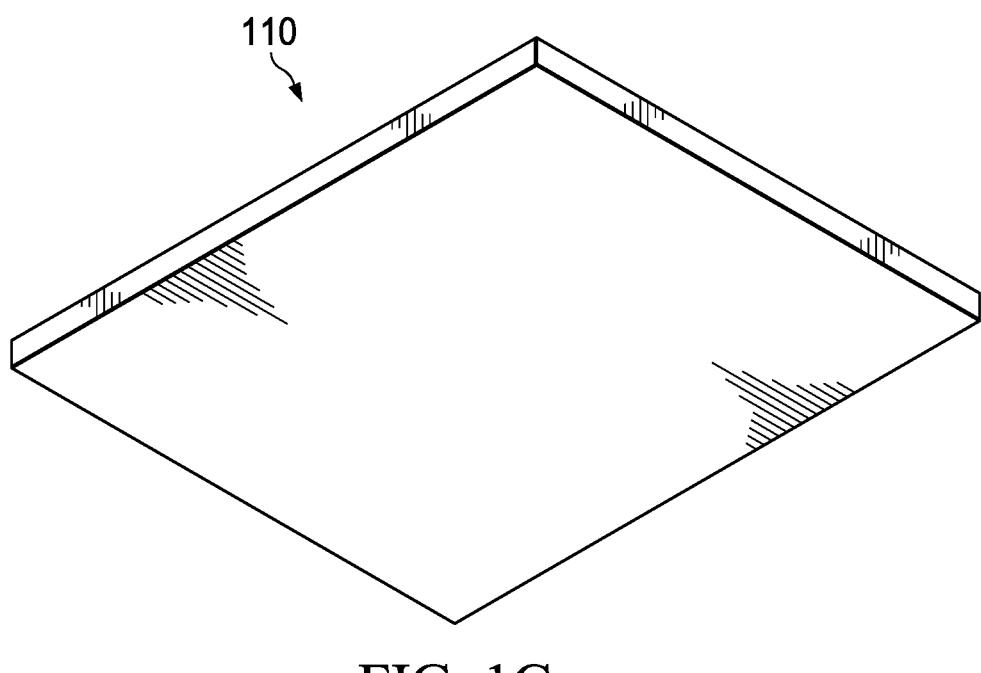
FIG. 1C is a perspective bottom view of a flexible substrate, in accordance with various examples.
Figure 1D:
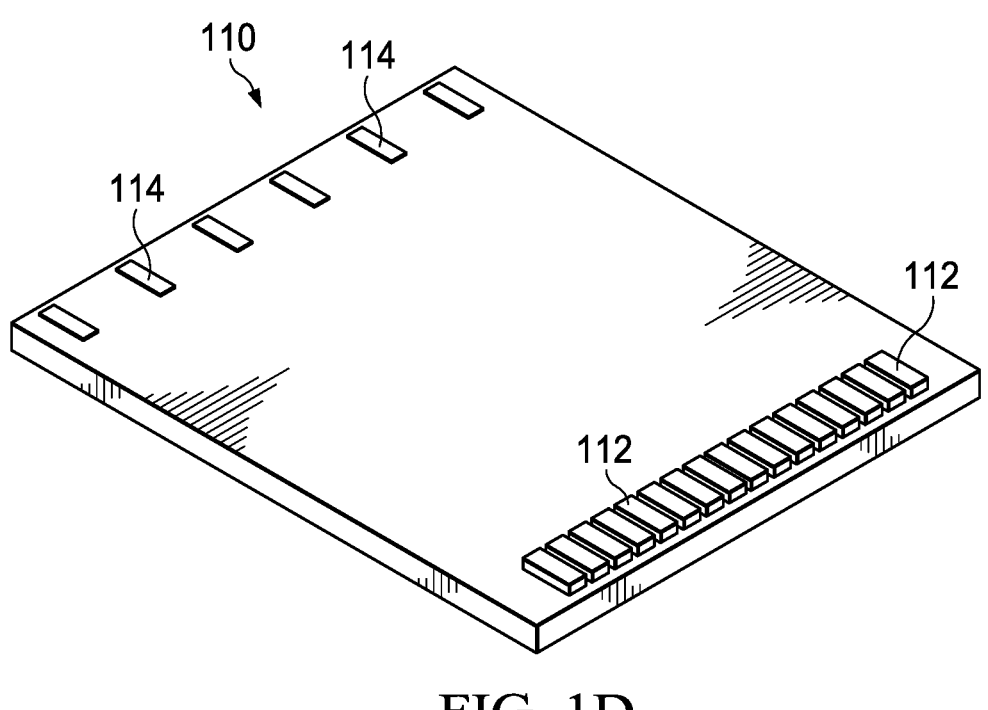
FIG. 1D is a perspective top view of a flexible substrate, in accordance with various examples.

FIG. 1C is a perspective bottom view of a flexible substrate 110, in accordance with various examples. In examples, the flexible substrate 110 has the ability to bend, conform, and roll into any suitable shape. Examples of a flexible substrate 110 may be the AI TECHNOLOGY® COUPLER® flexible substrate, or the single- or double-sided or MAXI-FLEX® flex circuits manufactured by ALL-FLEX®. The flexible substrate 110 may be composed of a polymer such as polyimide or polyethylene terephthalate (PET). The flexible substrate 110 includes multiple layers of insulation and conductive traces in any suitable combination. The insulation and conductive traces within and/or on top of the flexible substrate 110 may be arranged so as to enable communication between different areas of the flexible substrate 110, such as between the conductive terminals 112, 114 shown in FIG. 1D. For example, a signal received at a conductive terminal 112 may be provided to a conductive terminal 114 through a network of conductive traces within the flexible substrate 110, and, similarly, a signal received at a conductive terminal 114 may be provided to a conductive terminal 112 through the network of conductive traces within the flexible substrate 110.

Figure 1E:
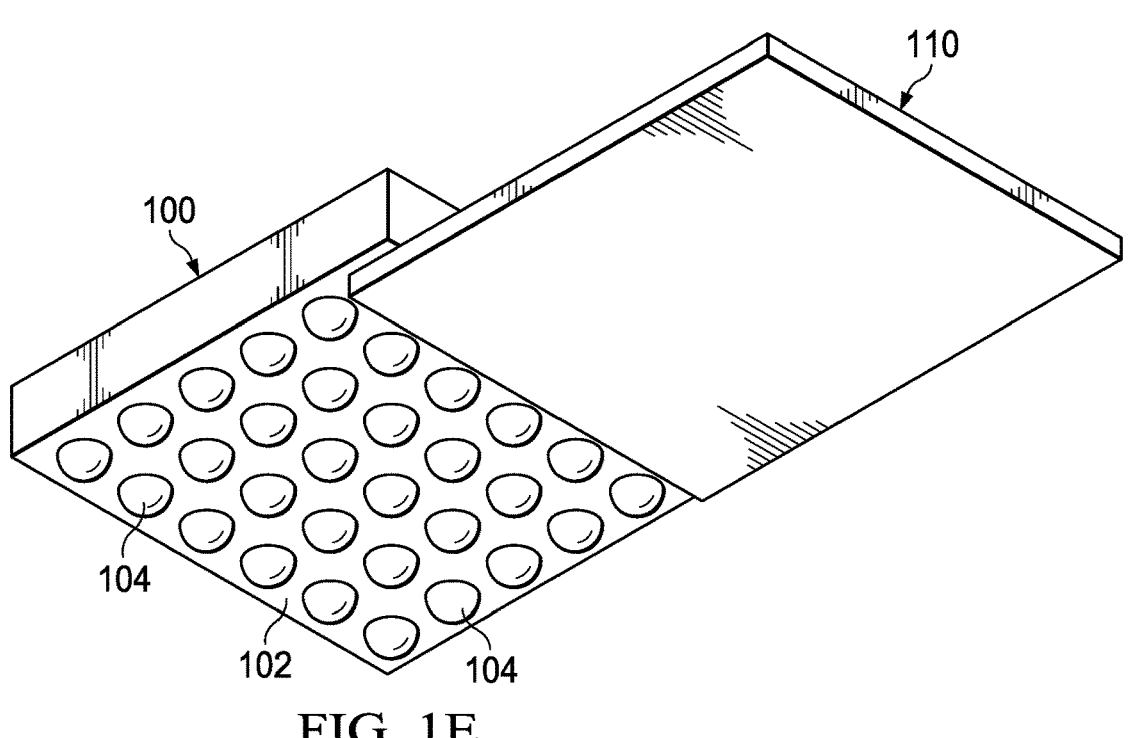
FIG. 1E is a perspective bottom view of a flexible substrate coupled to a semiconductor package, in accordance with various examples.
Figure 1F:
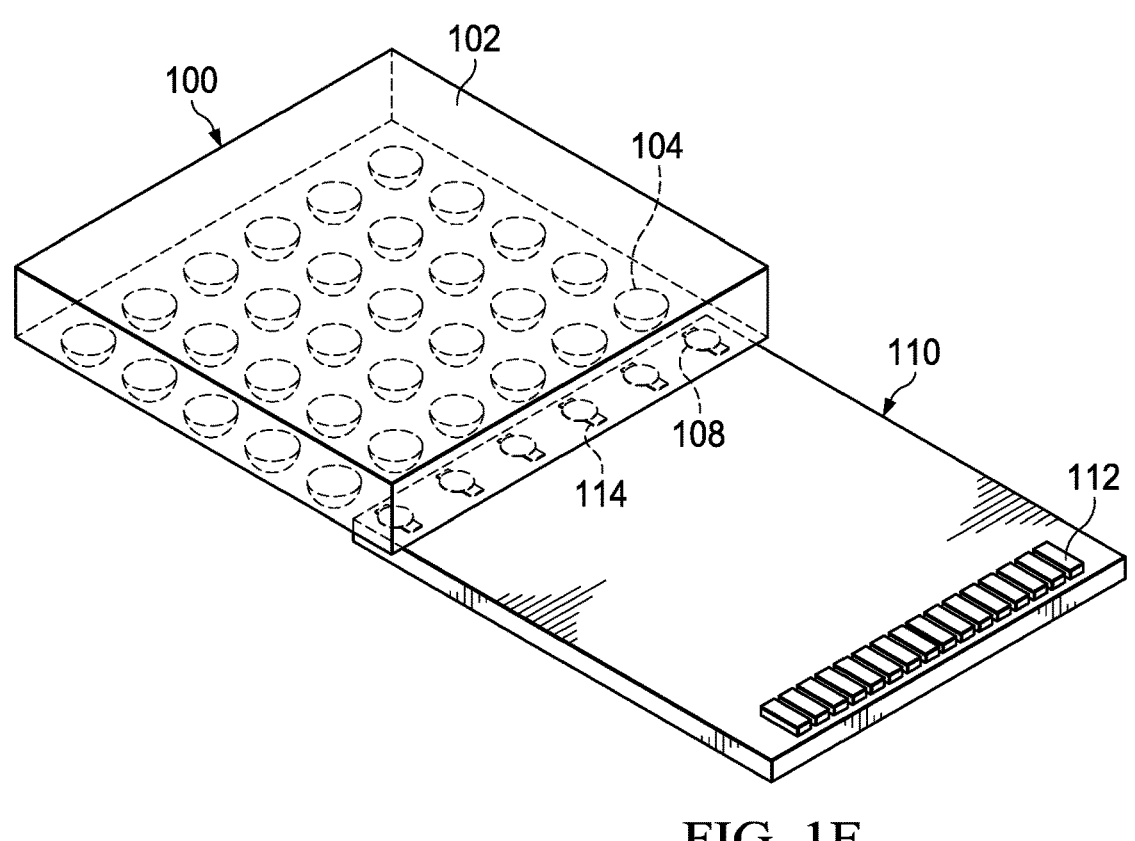
FIG. 1F is a perspective top view of a flexible substrate coupled to a semiconductor package, in accordance with various examples.
Figure 1G:
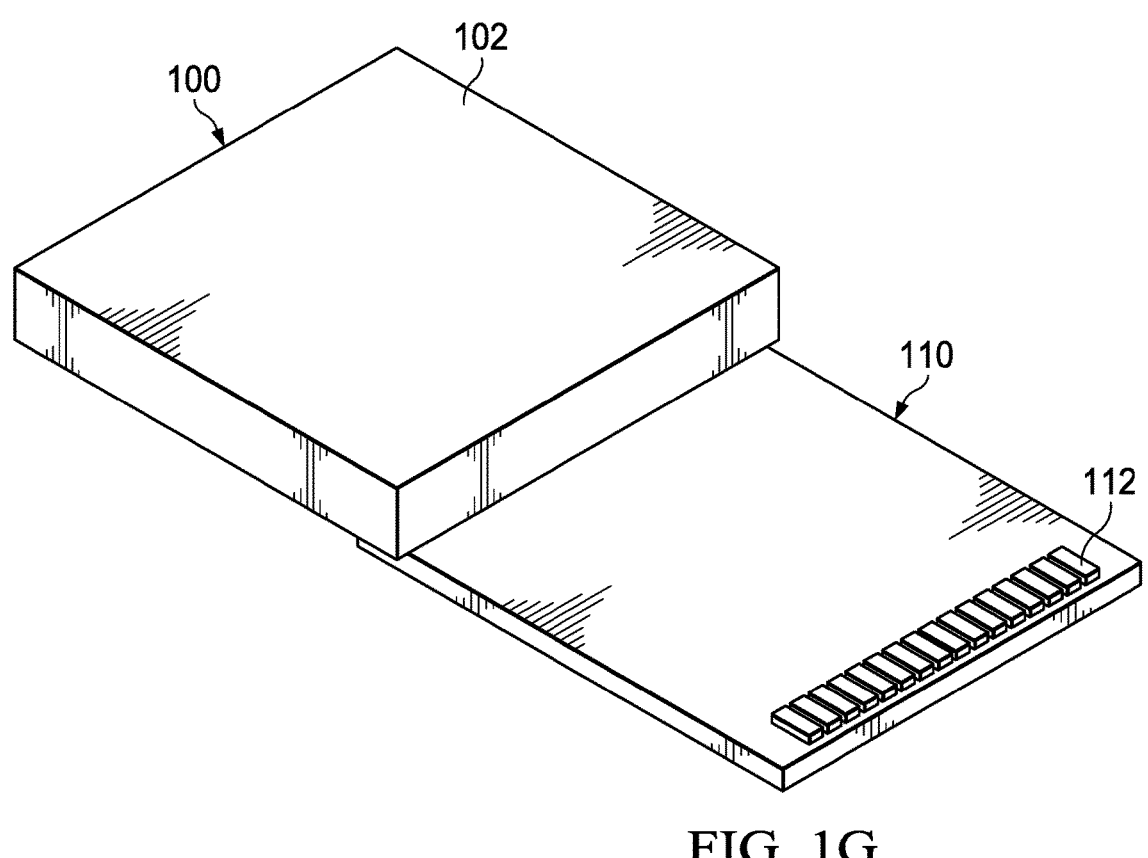
FIG. 1G is a perspective top view of a flexible substrate coupled to a semiconductor package, in accordance with various examples.
Figure 1H:
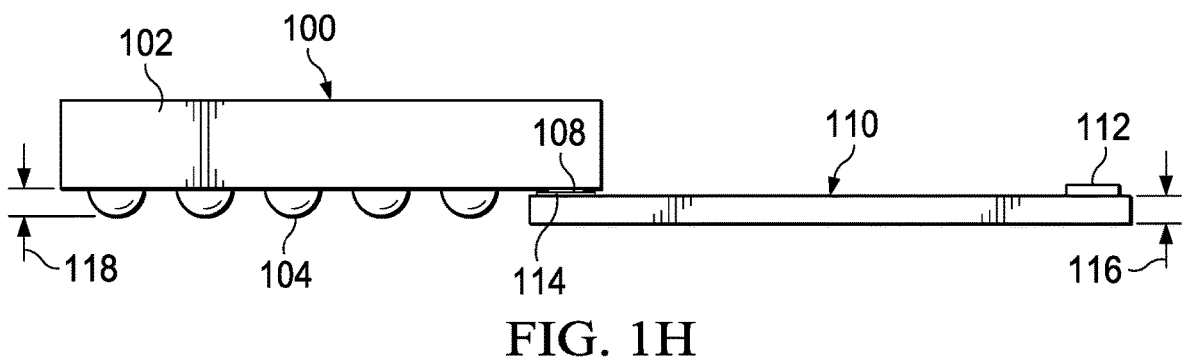
FIG. 1H is a profile view of a flexible substrate coupled to a semiconductor package, in accordance with various examples.
Figure 1I:
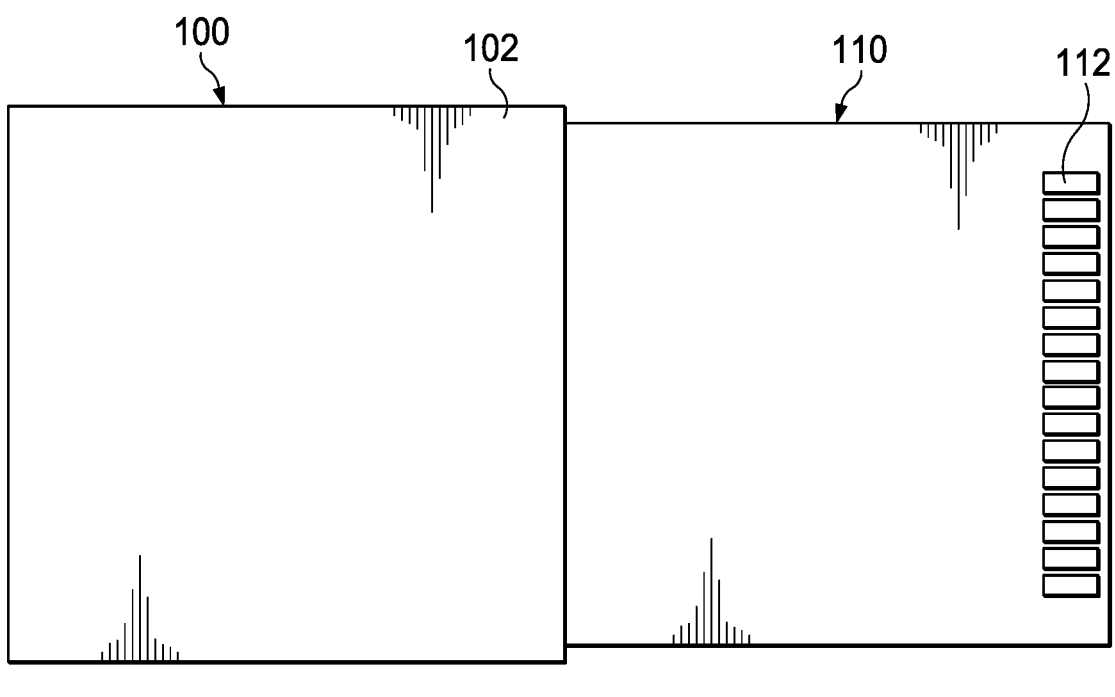
FIG. 1I is a top-down view of a flexible substrate coupled to a semiconductor package, in accordance with various examples.
Figure 1J:
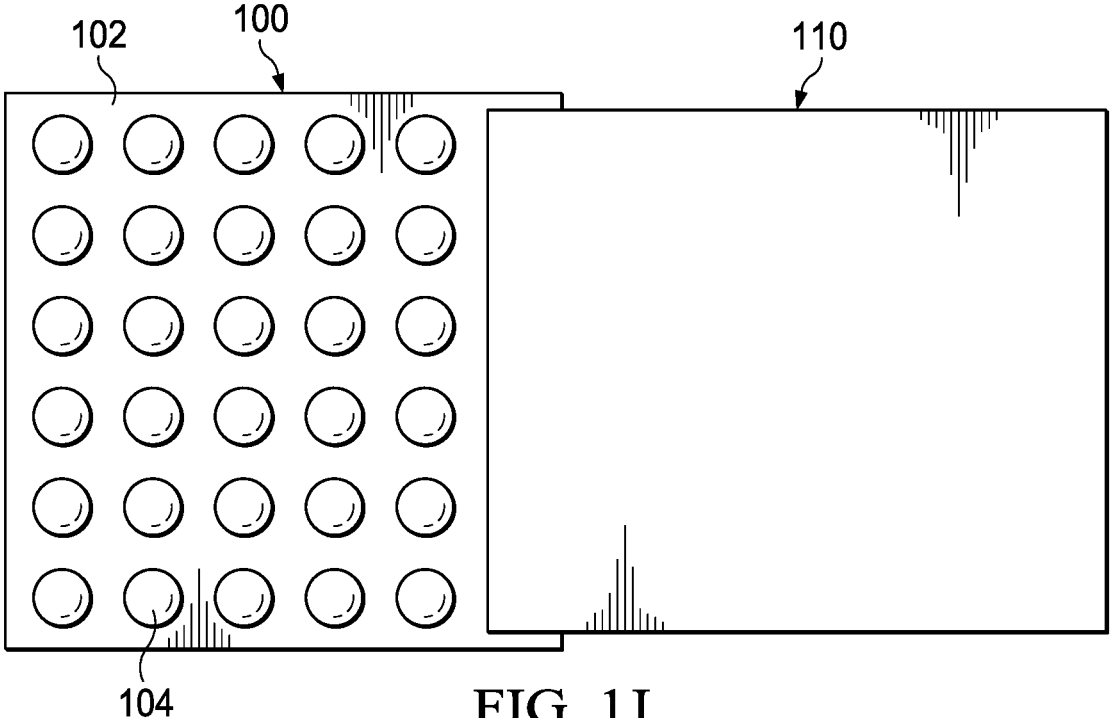
FIG. 1J is a bottom-up view of a flexible substrate coupled to a semiconductor package, in accordance with various examples.

FIG. 1E is a perspective bottom view of the flexible substrate 110 coupled to the semiconductor package 100, in accordance with various examples. More specifically, the conductive terminals 114 of the flexible substrate 110 are coupled to the conductive terminals 108 of the semiconductor package 100, and FIG. 1E shows the resulting structure. FIG. 1F is a semi-transparent, perspective top view of the structure of FIG. 1E, and FIG. 1G is a perspective top view of the structure of FIG. 1E. FIG. 1H is a profile view of the structure of FIG. 1E. In examples, the thickness of the flexible substrate 110, which is indicated by numeral 116, is less than or equal to a height of the conductive members 104, which is indicated by numeral 118. If the flexible substrate 110 is thicker than the height of the conductive members 104, the flexible substrate 110 will prevent the conductive members 104 from coupling to a PCB. Conversely, if the flexible substrate 110 is no thicker than the height of the conductive members 104, the conductive members 104 will be able to reach, and thus couple to, the PCB. The flexible substrate may range in thickness from 20 microns to 50 microns. FIG. 1I is a top-down view of the structure of FIGS. 1E-1H, and FIG. 1J is a bottom-up view of the structure of FIGS. 1E-1H, in accordance with various examples.

Figure 1K:
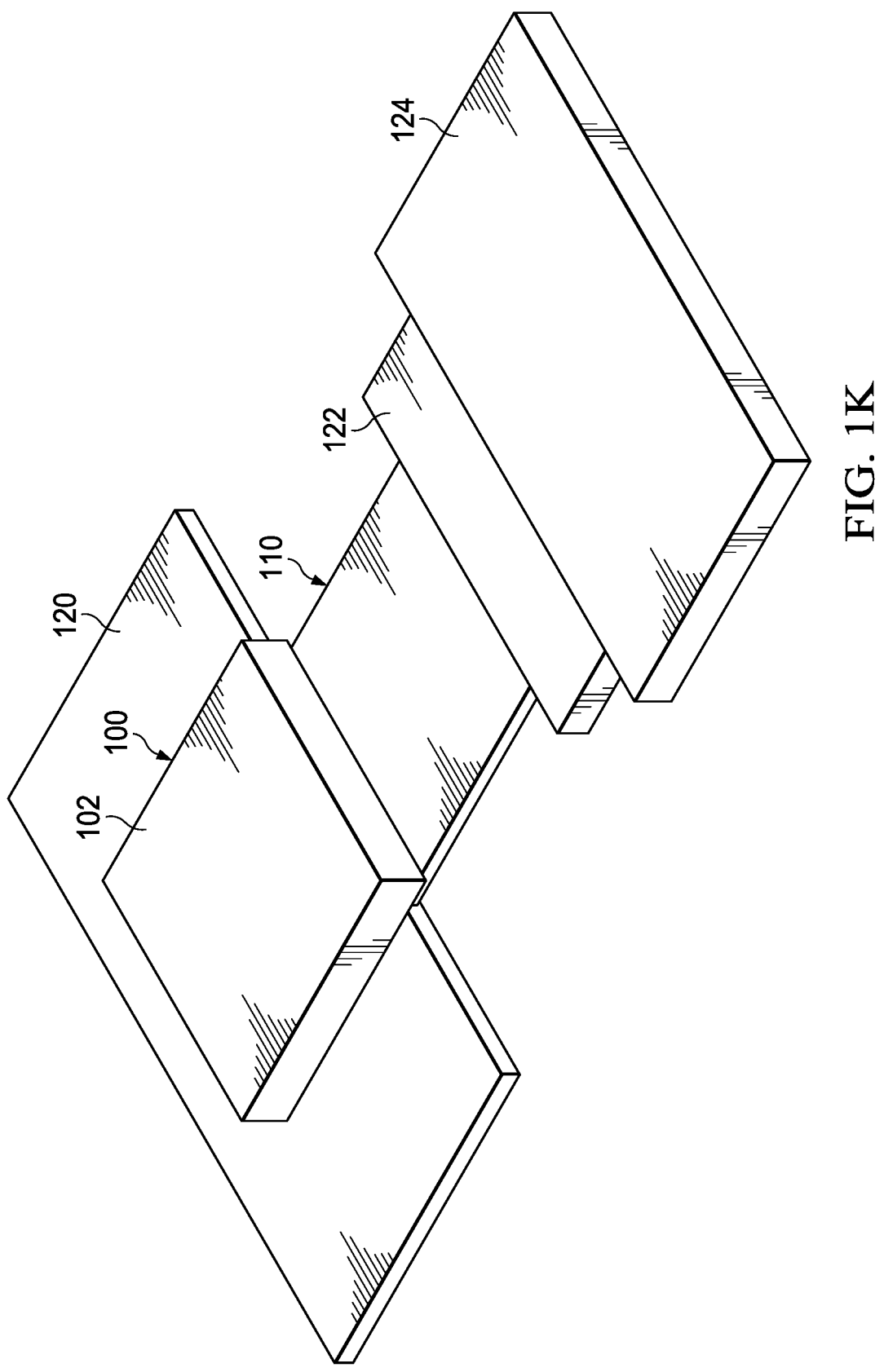
FIG. 1K is a perspective view of a semiconductor package coupled to a flexible substrate, the semiconductor package coupled to a printed circuit board (PCB), and the flexible substrate coupled to an imaging device, in accordance with various examples.
Figure 1L:
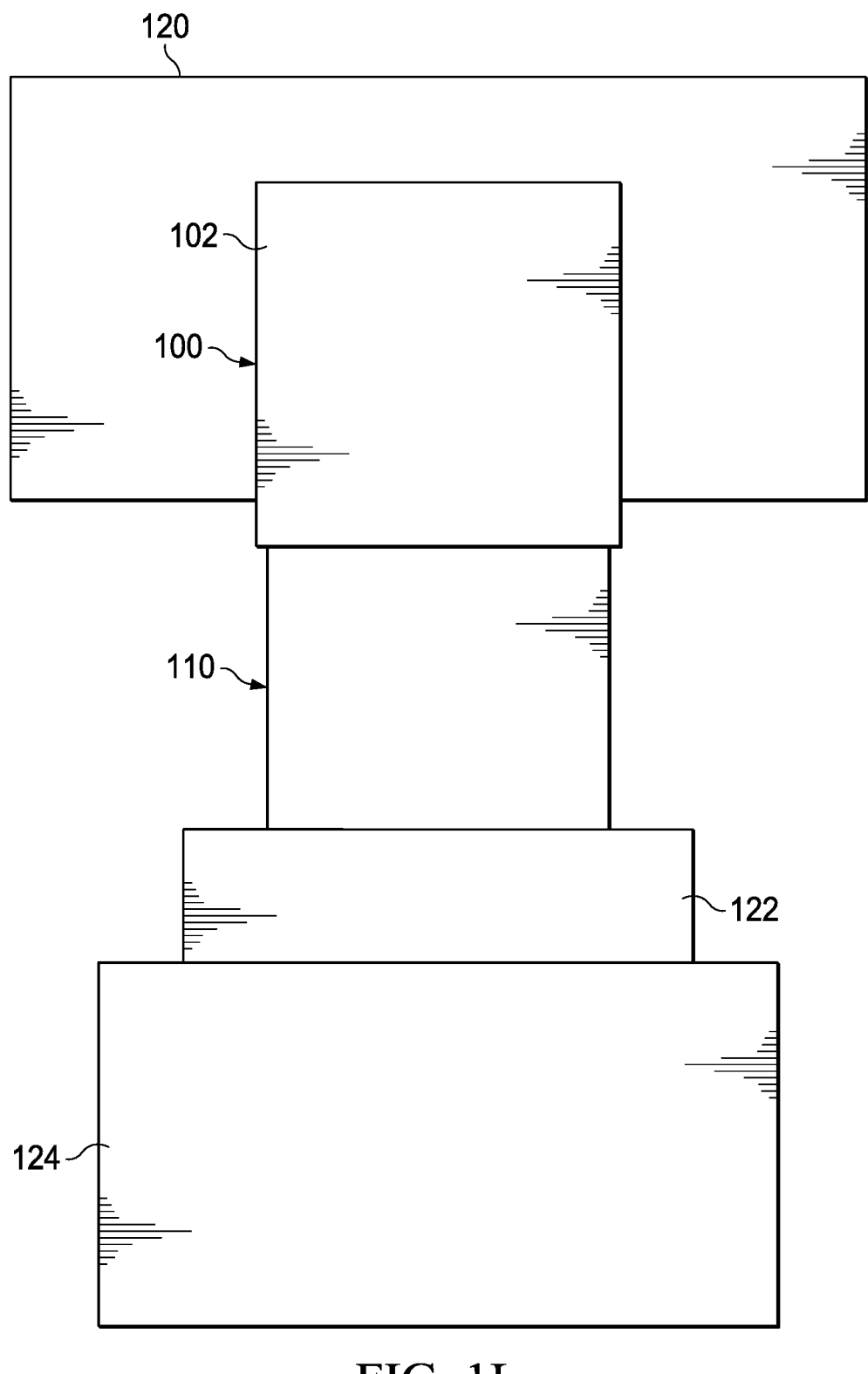
FIG. 1L is a top-down view of a semiconductor package coupled to a flexible substrate, the semiconductor package coupled to a PCB, and the flexible substrate coupled to an imaging device, in accordance with various examples.

FIG. 1K is a perspective view of the semiconductor package 100 coupled to a PCB 120, and the flexible substrate 110 coupled to a connector 122 of an electronic component 124 using conductive terminals 112 (FIG. 1D), in accordance with various examples. For instance, the electronic component 124 may be a pixel array of a digital x-ray machine, and the connector 122 may be a ZIF connector or another suitable type of connector. The scope of this disclosure is not limited to an electronic component 124 that is a digital x-ray machine, and a variety of components may be used instead of a pixel array of a digital x-ray machine. In some examples, the connector 122 may be omitted, and the conductive terminals 112 of the flexible substrate 110 may couple to the electronic component 124 through another structure, such as an anisotropic conductive film (ACF), a solder reflow process, etc. Still other coupling techniques are contemplated. The flexible substrate 110 has an appropriate stiffness to maintain structural and functional integrity when the flexible substrate 110 is composed of polyimide and the thickness of the flexible substrate 110 ranges from 20 microns to 50 microns. FIG. 1L is a top-down view of the structure of FIG. 1K, and FIG. 1M is a profile view of the structure of FIG. 1K.

Figures 1M, 1N:
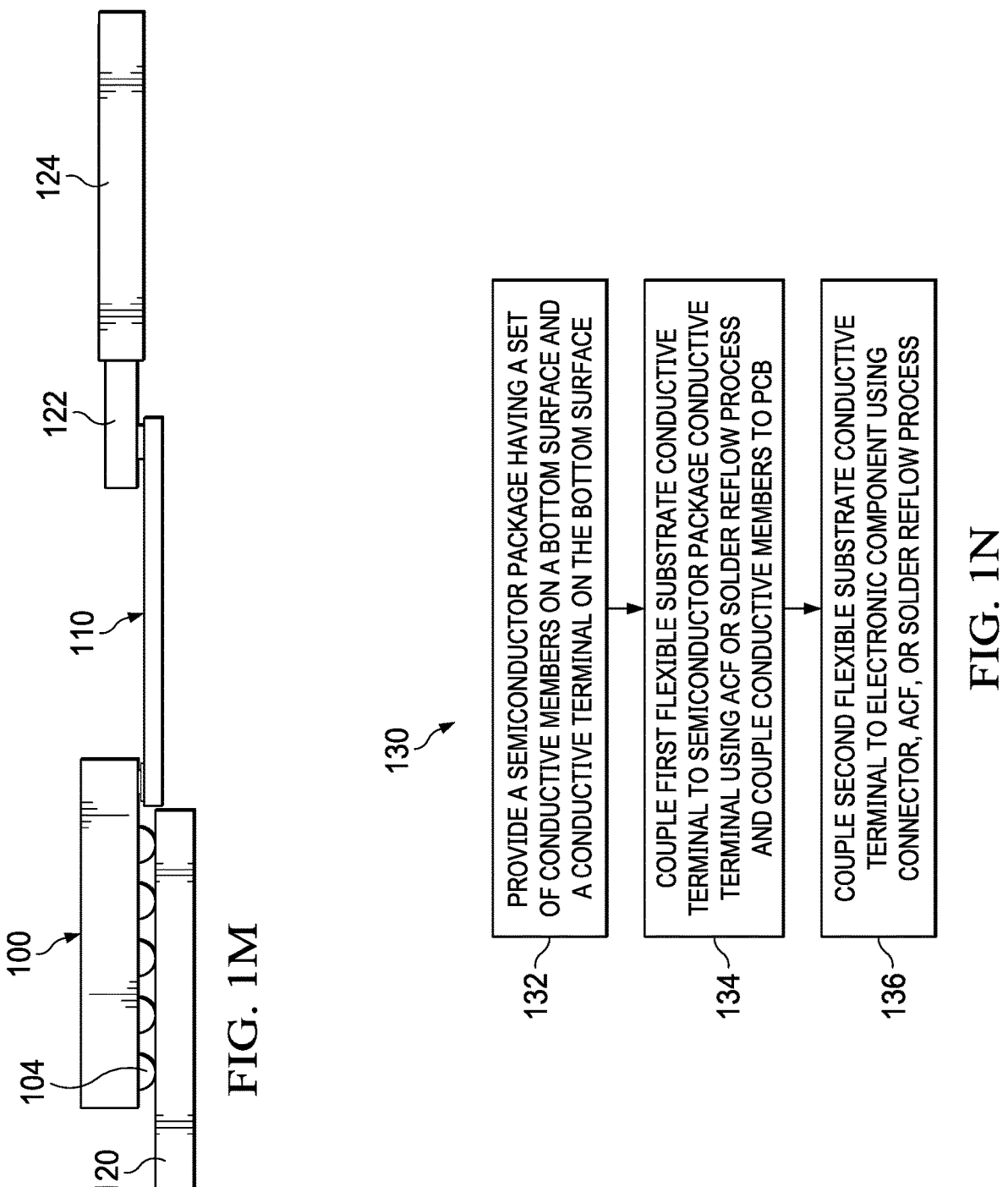
FIG. 1M is a profile view of a semiconductor package coupled to a flexible substrate, the semiconductor package coupled to a PCB, and the flexible substrate coupled to an imaging device, in accordance with various examples.
FIG. 1N is a flow diagram of a method for manufacturing a semiconductor package coupled to a flexible substrate, in accordance with various examples.

FIG. 1N is a flow diagram of a method 130 for manufacturing a semiconductor package coupled to a flexible substrate, such as in the structure of FIGS. 1K-1M, in accordance with various examples. The method 130 begins with providing a semiconductor package having a set of conductive members on a bottom surface and a conductive terminal on the bottom surface, such as in FIG. 1A (132). The method 130 includes coupling a first flexible substrate conductive terminal to the semiconductor package conductive terminal using ACF or a solder reflow process and coupling the conductive members to a PCB, such as is shown in FIGS. 1E-1M (134). The method 130 includes coupling a second flexible substrate conductive terminal to an electronic component using a connector, ACF, or a solder reflow process, such as is shown in FIGS. 1K-1M (136).

In alternative examples, the conductive members of the semiconductor package may be coupled to the PCB. The second flexible substrate conductive terminal may then be coupled to the electronic component, followed by a coupling of the first flexible substrate conductive terminal to the semiconductor package conductive terminal.

In still other examples, the second flexible substrate conductive terminal may be coupled to the electronic component. The first flexible substrate conductive terminal may then be coupled to the semiconductor package conductive terminal, and the semiconductor package may subsequently be coupled to the PCB using the conductive members.

In yet other examples, the first flexible substrate conductive terminal may be coupled to the semiconductor package conductive terminal. The second flexible substrate conductive terminal may then be coupled to the electronic component, followed by a coupling of the semiconductor package conductive members to the PCB.

Figure 1O:
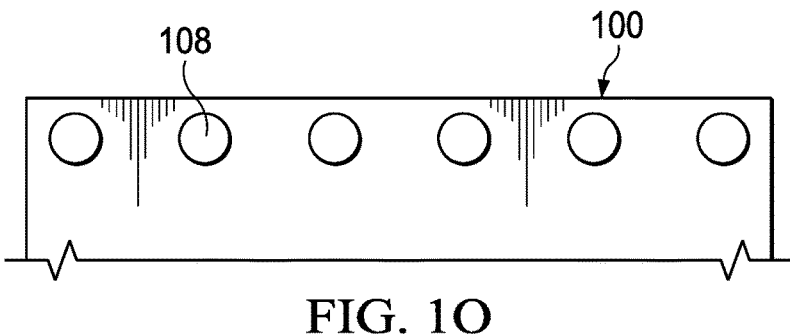
FIG. 1O is a bottom-up view of conductive terminals of a semiconductor package, in accordance with various examples.
Figure 1P:
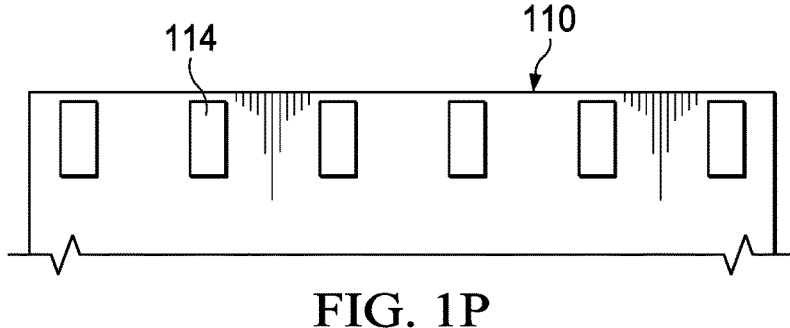
FIG. 1P is a top-down view of conductive terminals of a flexible substrate, in accordance with various examples.
Figure 1Q:
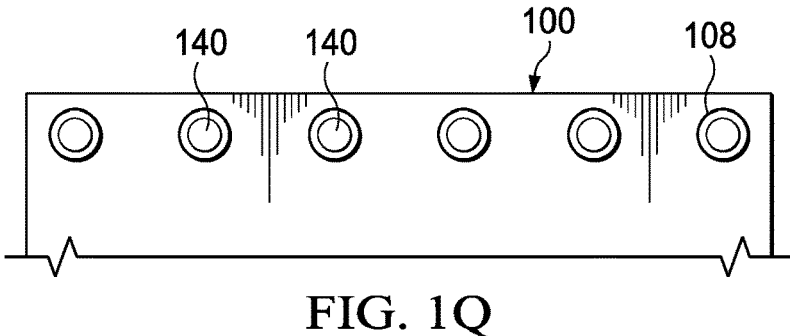
FIG. 1Q is a bottom-up view of conductive terminals of a semiconductor package having solder paste deposited thereon, in accordance with various examples.
Figure 1R:
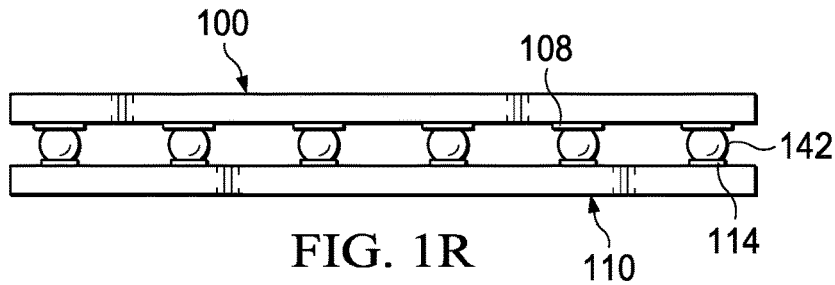
FIG. 1R is a profile cross-sectional view of a flexible substrate coupled to a semiconductor package by way of a solder reflow process, in accordance with various examples.

FIGS. 1O-1R depict a process flow by which a solder reflow process is used to couple the conductive terminals 108 and 114 to each other to produce the structure shown, for example, in FIG. 1E. FIG. 1O shows a bottom-up view of the conductive terminals 108, and FIG. 1P shows a top-down view of the conductive terminals 114. FIG. 1Q shows the deposition of solder paste 140 on each of the conductive terminals 108, and, after a solder reflow process is performed, solder balls 142 couple each conductive terminal 108 to a respective conductive terminal 114, as FIG. 1R shows. As explained above with reference to FIG. 1H, the thickness of the flexible substrate 110 is no greater than the height of the conductive members 104. However, if a solder reflow process is used to couple the conductive terminals 108, 114 to each other as shown in FIG. 1R, the thickness of the flexible substrate 110 must be reduced to accommodate for the height introduced by the solder balls 142. Thus, in such cases, the sum of the height of the solder balls 142 and the thickness of the flexible substrate 110 must be less than or equal to the height of the conductive members 104.

Figure 1S:
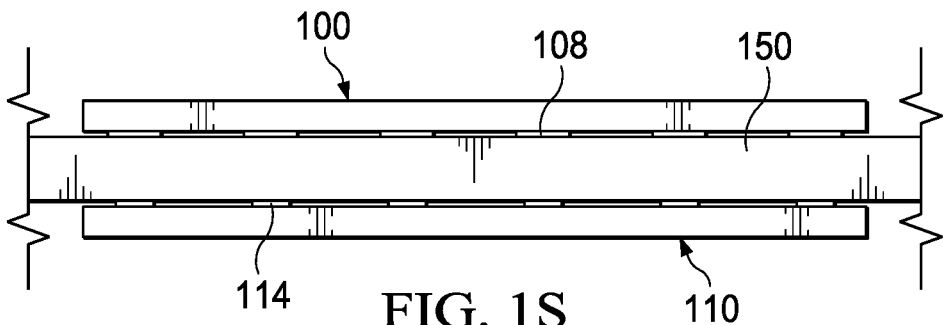
FIG. 1S is a profile cross-sectional view of a flexible substrate and a semiconductor package having an anisotropic conductive film (ACF) positioned therebetween, in accordance with various examples.
Figure 1T:
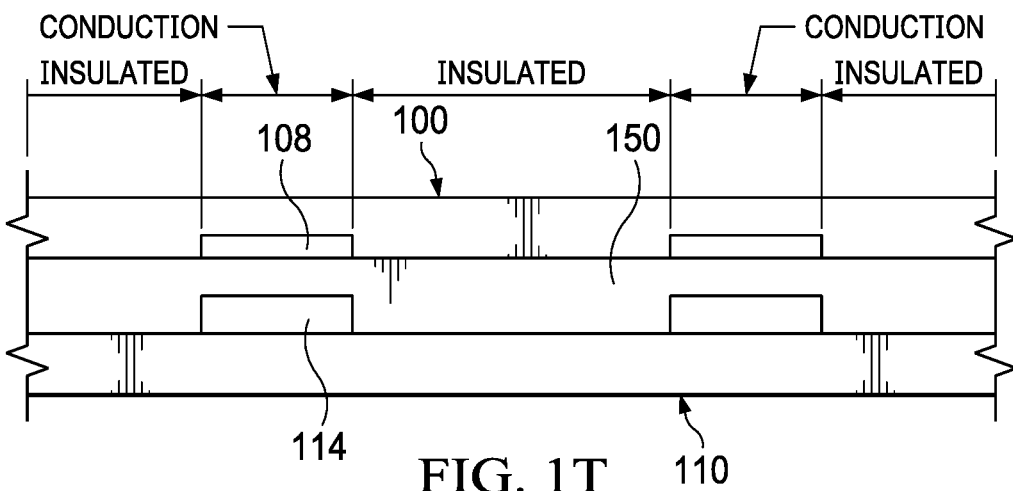
FIG. 1T is a profile cross-sectional view of a flexible substrate coupled to a semiconductor package by way of an ACF, in accordance with various examples.

Alternatively, as explained above, an ACF may be used in lieu of a solder reflow process to couple the conductive terminals 108, 114 to each other. FIG. 1S is a profile cross-sectional view of the flexible substrate 110 and the semiconductor package 100 having conductive terminals 114, 108, respectively. An ACF 150 is positioned between the semiconductor package 100 and the flexible substrate 110, as shown. Heat and pressure are applied to the semiconductor package 100 to produce the structure shown in FIG. 1T, in which the ACF 150 is compressed to permit conduction between respective pairs of conductive terminals 108, 114, and to provide insulation in the remaining areas of the ACF 150, as shown.

Figure 2A:
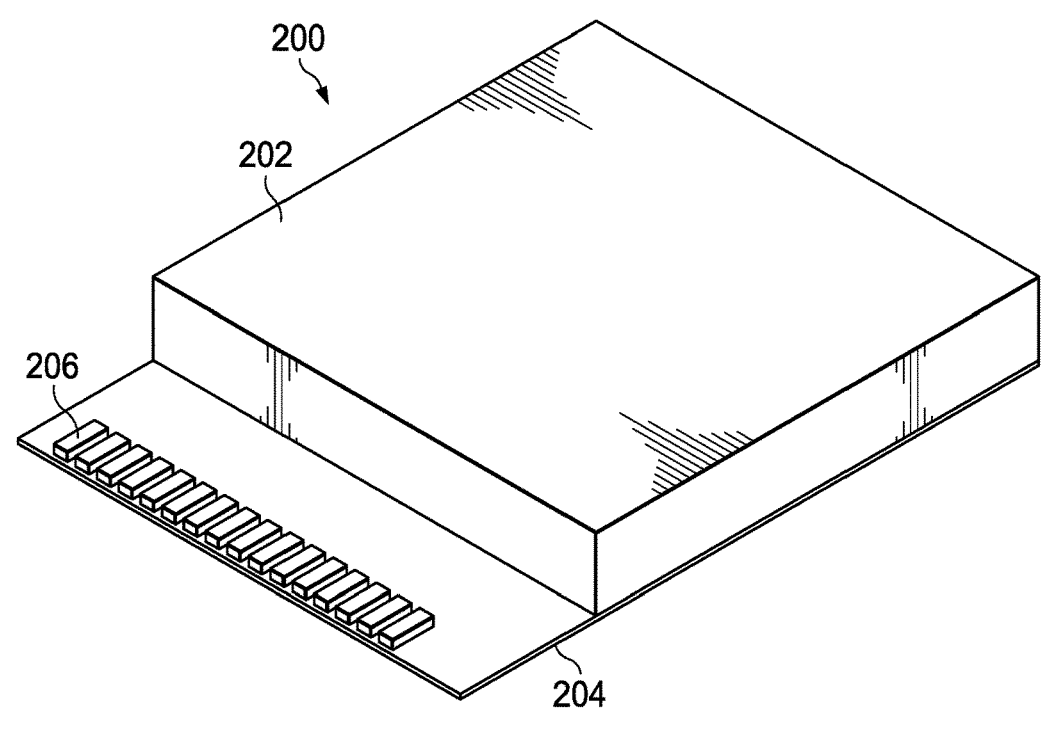
FIG. 2A is a perspective view of a semiconductor package having a substrate, at least part of which is not covered by a mold compound, in accordance with various examples.
Figure 2B:
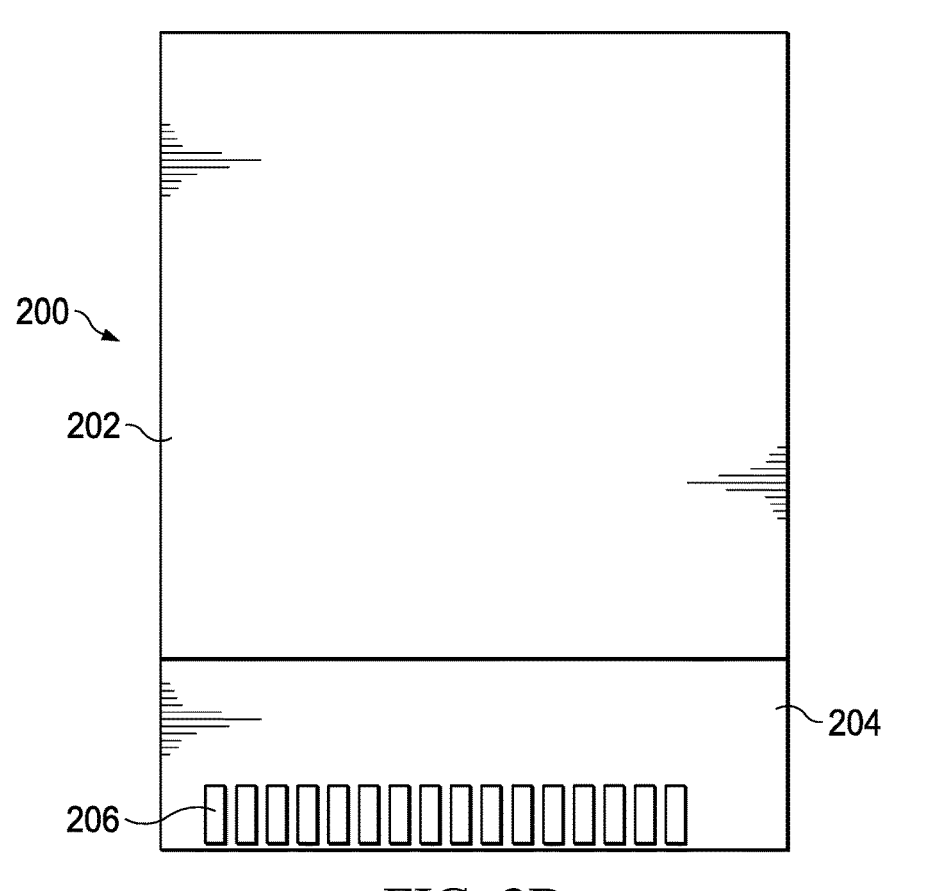
FIG. 2B is a top-down view of a semiconductor package having a substrate, at least part of which is not covered by a mold compound, in accordance with various examples.

FIG. 2A is a perspective view of a semiconductor package 200 having a substrate 204, at least part of which is not covered by a mold compound 202, in accordance with various examples. More specifically, the substrate 204 is a rigid substrate (e.g., not a flexible substrate) that includes a portion that is covered by the mold compound 202 and a portion that is not covered by the mold compound 202. The portion covered by the mold compound 202 is considered to be part of the semiconductor package 200 and is useful to route signals between the semiconductor die within the semiconductor package 200 and a component (e.g., a PCB) to which the semiconductor package 200 may couple. The portion of the substrate 204 that is not covered by the mold compound 202 includes conductive terminals 206 that couple to circuitry (e.g., the semiconductor die within the mold compound 202) by way of a network of conductive traces embedded within the substrate 204. FIG. 2B is a top-down view of the structure of FIG. 2A, in accordance with various examples. FIG. 2C is a bottom-up view of the structure of FIG. 2A, in accordance with various examples. FIG. 2D is a profile view of the structure of FIG. 2A, in accordance with various examples.

The conductive terminals 206 have a high density, meaning the conductive terminals 206 have a pitch that ranges from 25 microns to 150 microns. As explained above, the solutions described herein are especially useful when the PCB trace density requirements are unacceptably high, and thus the pitch of the conductive terminals 206 will be low. Further, to accommodate such a low pitch, the shapes and/or sizes of the conductive terminals 206 are specifically configured to be rectangular in shape and to have lengths that reliably produce low contact resistance from the bonding that occurs with the conductive terminals 206 when connections to the conductive terminals 206 are established.

Figure 2E:
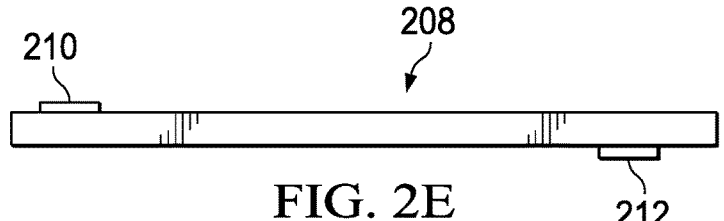
FIG. 2E is a profile view of a flexible substrate, in accordance with various examples.
Figure 2F:
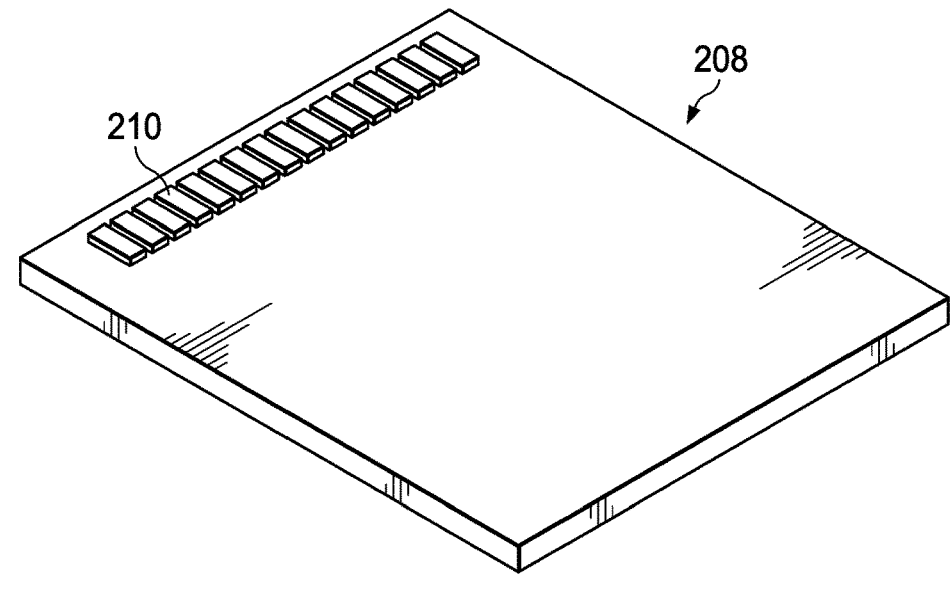
FIG. 2F is a perspective top view of a flexible substrate, in accordance with various examples.
Figure 2G:
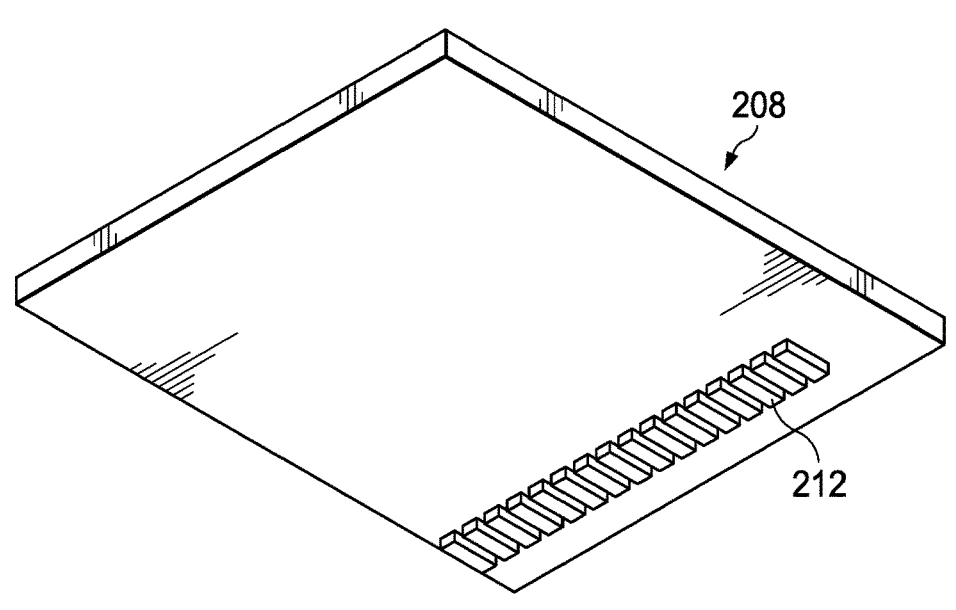
FIG. 2G is a perspective bottom view of a flexible substrate, in accordance with various examples.

FIG. 2E is a profile view of a flexible substrate 208, in accordance with various examples. The flexible substrate 208 may be similar in some respects to the flexible substrate 110 described above, for example, in terms of the stiffness. Further, like the flexible substrate 110, the flexible substrate 208 includes conductive terminals at opposing ends of the flexible substrate 208, but unlike the flexible substrate 110, the conductive terminals of the flexible substrate 208 are on opposing surfaces of the flexible substrate 208. More specifically, as FIG. 2E shows, the flexible substrate 208 includes conductive terminals 210 and 212, which are on opposing surfaces of the flexible substrate 208. The conductive terminals 210, 212 couple to each other by way of a network of conductive traces (not specifically shown) embedded within the flexible substrate 208. FIG. 2F is a perspective top view of the structure of FIG. 2E in accordance with various examples. FIG. 2G is a perspective bottom view of the structure of FIG. 2E in accordance with various examples.

Figure 2H:
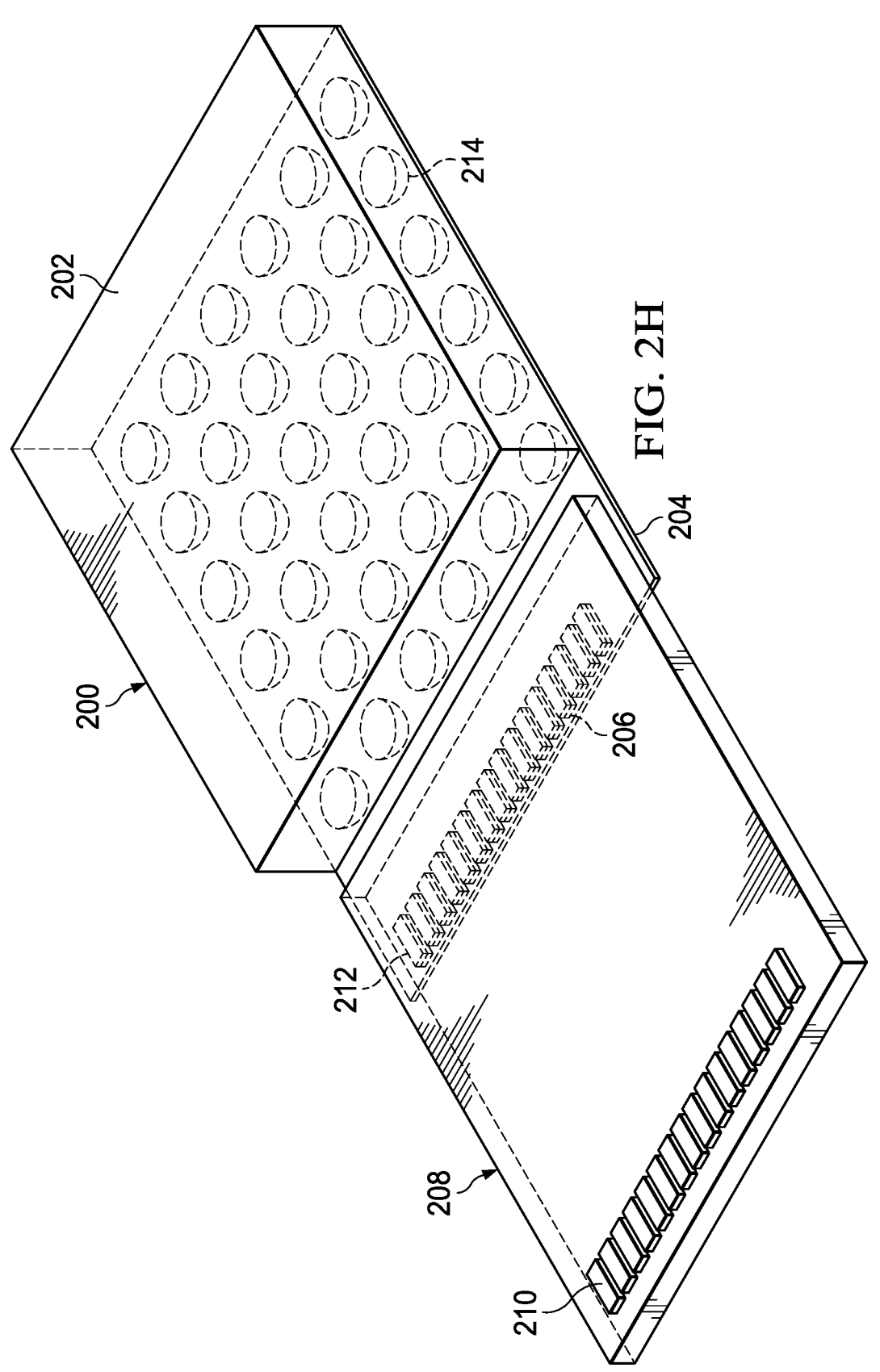
FIG. 2H is a perspective top view of a flexible substrate coupled to a semiconductor package, in accordance with various examples.
Figures 2I, 2J:
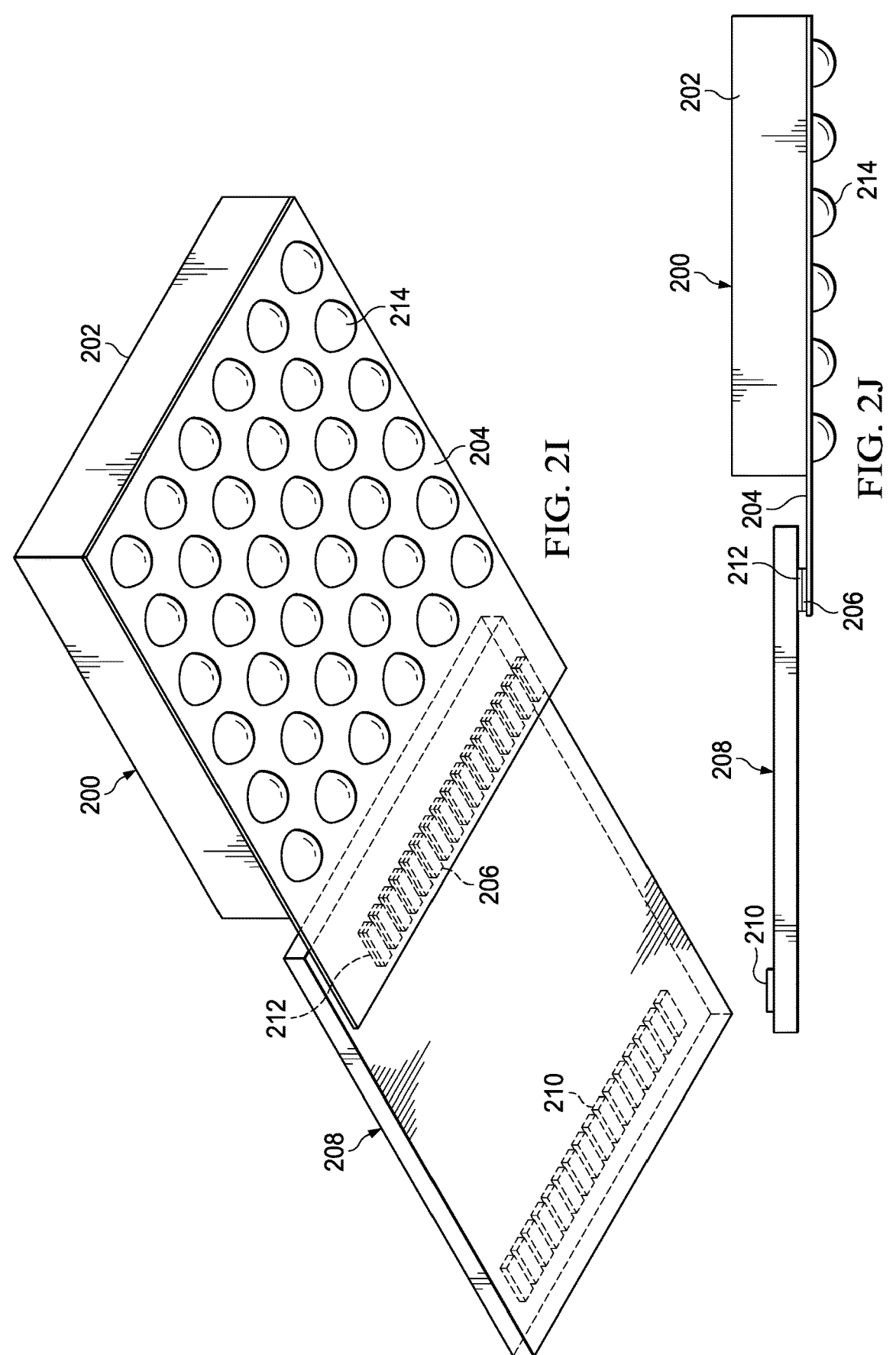
FIG. 2I is a perspective bottom view of a flexible substrate coupled to a semiconductor package, in accordance with various examples.
FIG. 2J is a profile view of a flexible substrate coupled to a semiconductor package, in accordance with various examples.

The structures of FIGS. 2A-2D and 2E-2G may be coupled to each other to produce the structure of FIG. 2H. FIG. 2H is a perspective top view of the semiconductor package 200 coupled to the flexible substrate 208. More specifically, the conductive terminals 206 of the substrate 204 (FIG. 2A) are coupled to the conductive terminals 212 of the flexible substrate 208 (FIG. 2E). The conductive terminals 206, 212 may be coupled to each other using ACF, a solder reflow process, or any other suitable process, such as described above with reference to FIGS. 1O-1T. The thickness restrictions on the flexible substrate 110 described above do not apply to the thickness of the flexible substrate 208, as the flexible substrate 208 is coupled to a top side of the substrate 204. Thus, regardless of the thickness of the flexible substrate 208, conductive members 214 on a bottom surface of the semiconductor package 200 will be able to couple to a PCB or other component as may be appropriate. FIG. 2I is a perspective bottom view of the structure of FIG. 2H, in accordance with various examples. FIG. 2J is a profile view of the structure of FIG. 2H, in accordance with various examples.

Figures 2K, 2L:
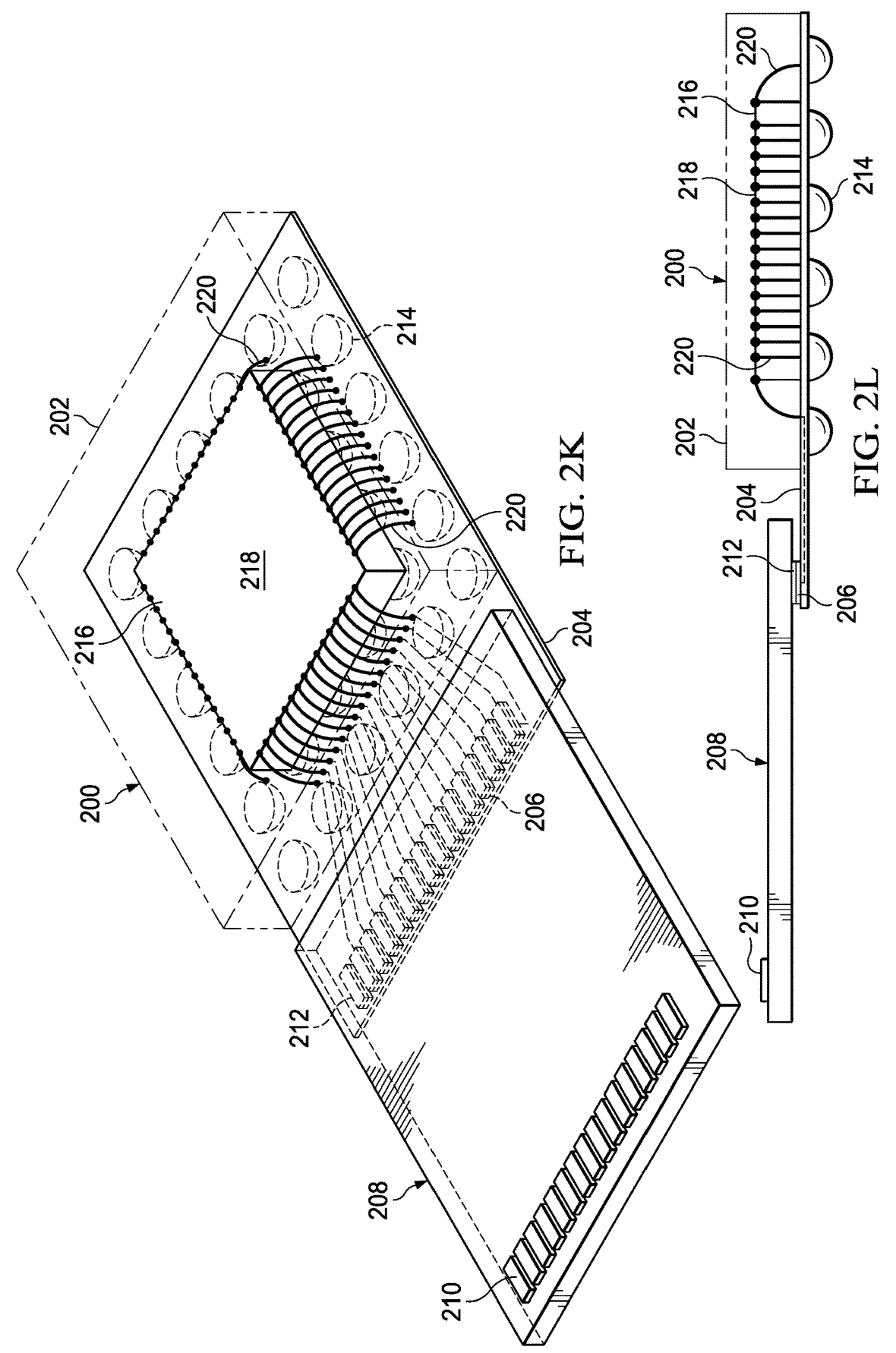
FIG. 2K is a partially transparent view of a flexible substrate coupled to a semiconductor package, in accordance with various examples.
FIG. 2L is a partially transparent profile view of a flexible substrate coupled to a semiconductor package, in accordance with various examples.
Figure 2M:
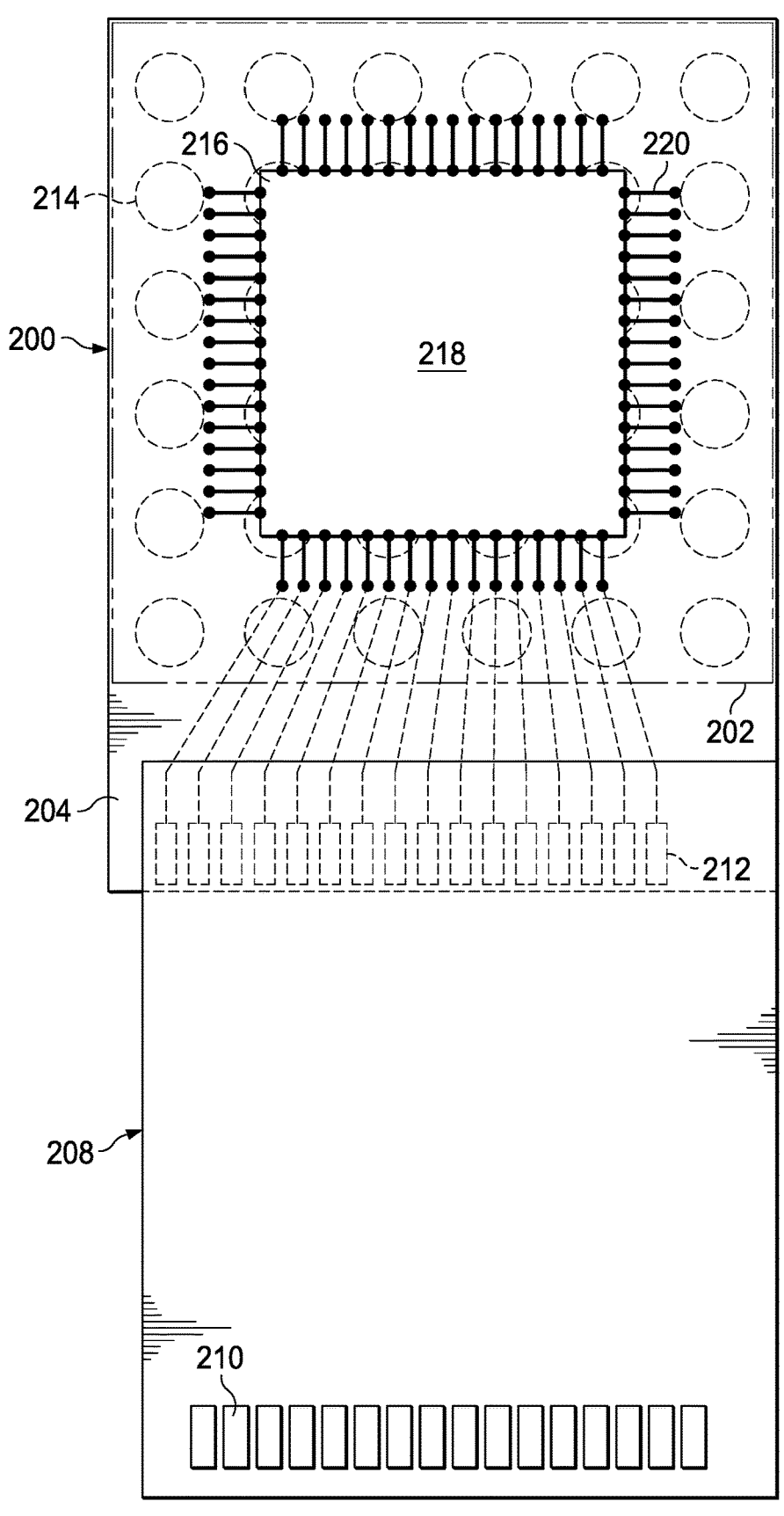
FIG. 2M is a partially transparent top-down view of a flexible substrate coupled to a semiconductor package, in accordance with various examples.

FIG. 2K is a partially transparent view of the structure of FIG. 2H, in accordance with various examples. FIG. 2K is identical to FIG. 2H with the exception of the depiction of components internal to the semiconductor package 200. For example, the semiconductor package 200 may include a semiconductor die 216 having a device side 218 with circuitry formed therein. Bond wires 220 couple the device side 218 to the substrate 204, and the substrate 204, in turn, couples the bond wires 220 to the conductive members 214 and/or to the conductive terminals 206. The mold compound 202 covers the semiconductor die 216, the bond wires 220, and portions of the substrate 204. The flexible substrate 208 couples to the conductive terminals 206 by way of conductive terminals 212. FIG. 2L is a profile view of the structure of FIG. 2K, in accordance with various examples. FIG. 2M is a top-down view of the structure of FIG. 2K, in accordance with various examples.

FIG. 2N is a flow diagram of a method 230 for manufacturing a flexible substrate coupled to a semiconductor package, in accordance with various examples. The method 230 includes providing a semiconductor package (e.g., semiconductor package 200 of FIG. 2A) having a set of conductive members (e.g., conductive members 214 of FIG. 2H) on a bottom surface and an exposed substrate (e.g., substrate 204, FIG. 2A) portion not covered by a mold compound (e.g., mold compound 202, FIG. 2A), the top surface of the exposed substrate portion having conductive terminals (e.g., conductive terminals 206, FIG. 2A) (232). The method 230 includes coupling first flexible substrate conductive terminals (e.g., conductive terminals 212 on flexible substrate 208, FIG. 2E) to semiconductor package conductive terminals (e.g., conductive terminals 206, FIG. 2A) using ACF or a solder reflow process, and coupling conductive members (e.g., conductive members 214, FIG. 2E) to a PCB (234), using, for example, an ACF or solder reflow process. The ACF or solder reflow process is similar to that described above with reference to FIGS. 1O-1T and thus is not repeated here. The method 230 includes coupling second flexible substrate conductive terminals (e.g., conductive terminals 210, FIG. 2H) to an electronic device (e.g., a PCB) using a connector, ACF, or a solder reflow process (236). The ACF or solder reflow process is similar to that described above with reference to FIGS. 1O-1T and thus is not repeated here. The order in which the steps of the method 230 are performed may be adjusted to achieve any suitable sequence, and all such permutations are encompassed in the scope of this disclosure.

Figure 2O:
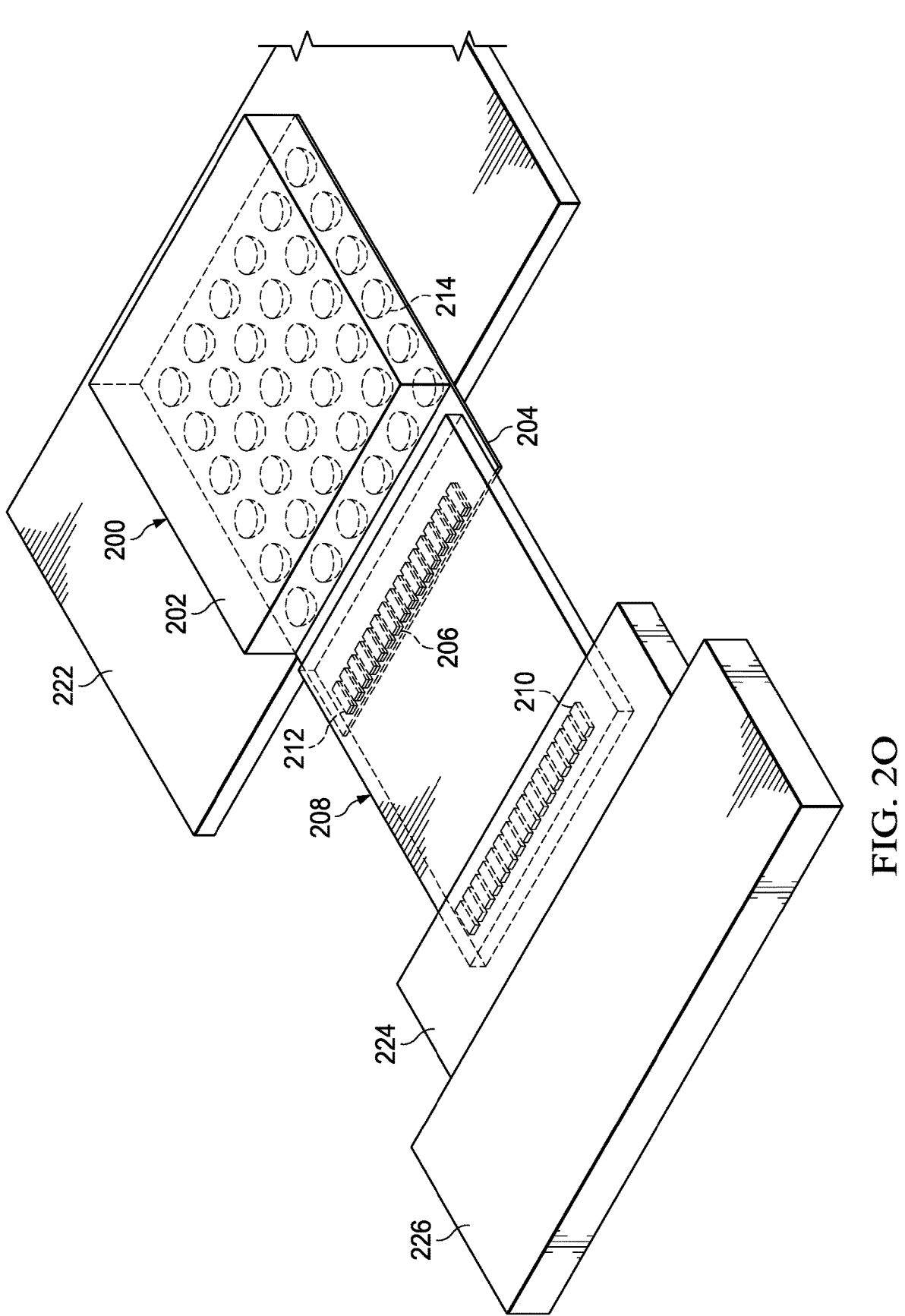
FIG. 2O is a perspective view of a semiconductor package coupled to a flexible substrate and to a PCB, and the flexible substrate coupled to an electronic component, in accordance with various examples.

FIG. 2O is a perspective view of the semiconductor package 200 coupled to the flexible substrate 208 and to a PCB 222. The flexible substrate 208 is coupled to an electronic component 226, for example, by way of a connector 224. For instance, the electronic component 226 may be a pixel array of a digital x-ray machine, and the connector 224 may be a ZIF connector or another suitable type of connector. The scope of this disclosure is not limited to an electronic component 226 that is a digital x-ray machine, and a variety of components may be used instead of a pixel array of a digital x-ray machine. In some examples, the connector 224 may be omitted, and the conductive terminals 210 of the flexible substrate 208 may couple to the electronic component 226 through another structure, such as an ACF, a solder reflow process, etc. Still other coupling techniques are contemplated.

Figure 3A:
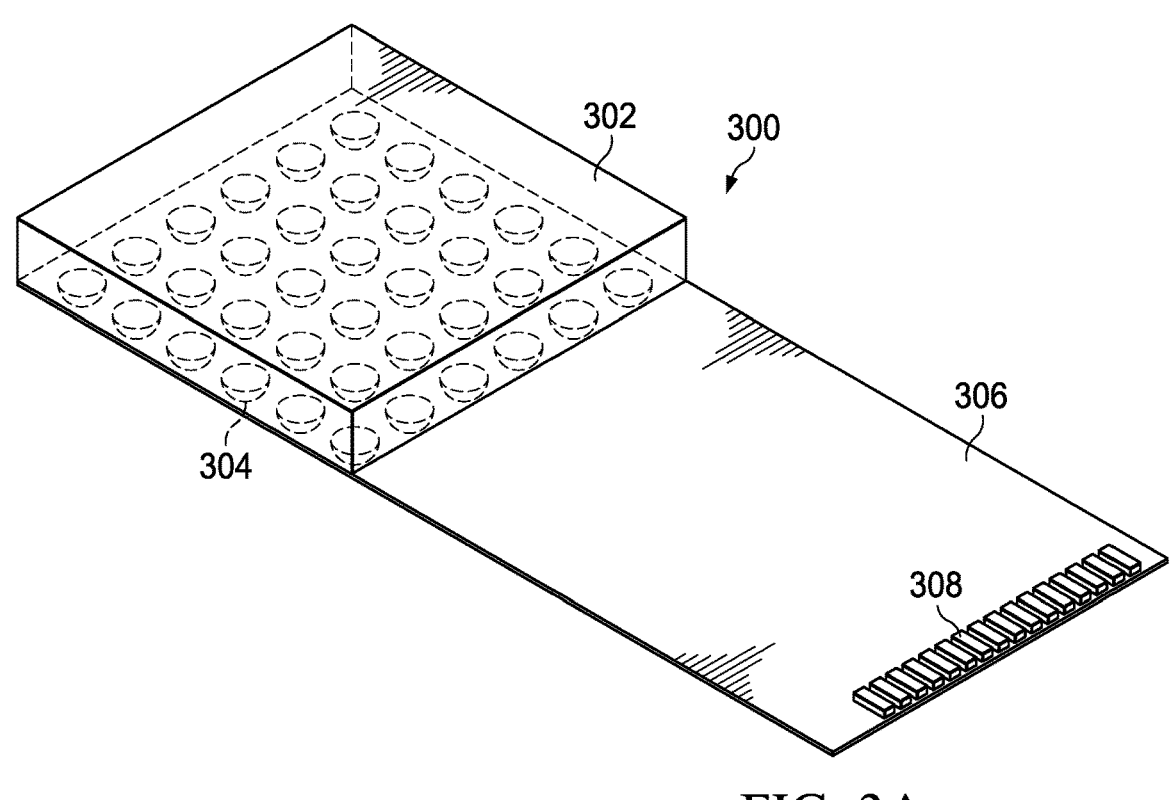
FIG. 3A is a perspective top view of a semiconductor package having a flexible substrate that is partially not covered by a mold compound, in accordance with various examples.

FIG. 3A is a perspective top view of a semiconductor package 300 having a flexible substrate, in accordance with various examples. The semiconductor package 300 includes a flexible substrate 306, a portion of which is covered by a mold compound 302, and a portion of which is not covered by the mold compound 302. Thus, unlike other examples in which a rigid substrate within the package couples to a flexible substrate outside the package, in the example of FIG. 3A, the flexible substrate 306 is present both inside and outside the mold compound 302 and serves as the only substrate in the structure of FIG. 3A. The semiconductor package 300 includes a set of conductive members 304 (e.g., solder balls) on a bottom surface of the flexible substrate 306. A distal end of the flexible substrate 306 includes conductive terminals 308 on a top surface of the flexible substrate 306, as shown. A network of conductive traces embedded within the flexible substrate 306 connects the conductive terminals 308 to circuitry (e.g., a semiconductor die) within the semiconductor package 300. The flexible substrate 306 has an appropriate stiffness to maintain structural and functional integrity when the flexible substrate 306 is composed of polyimide and the thickness of the flexible substrate 306 ranges from 20 microns to 50 microns.

Figure 3B:
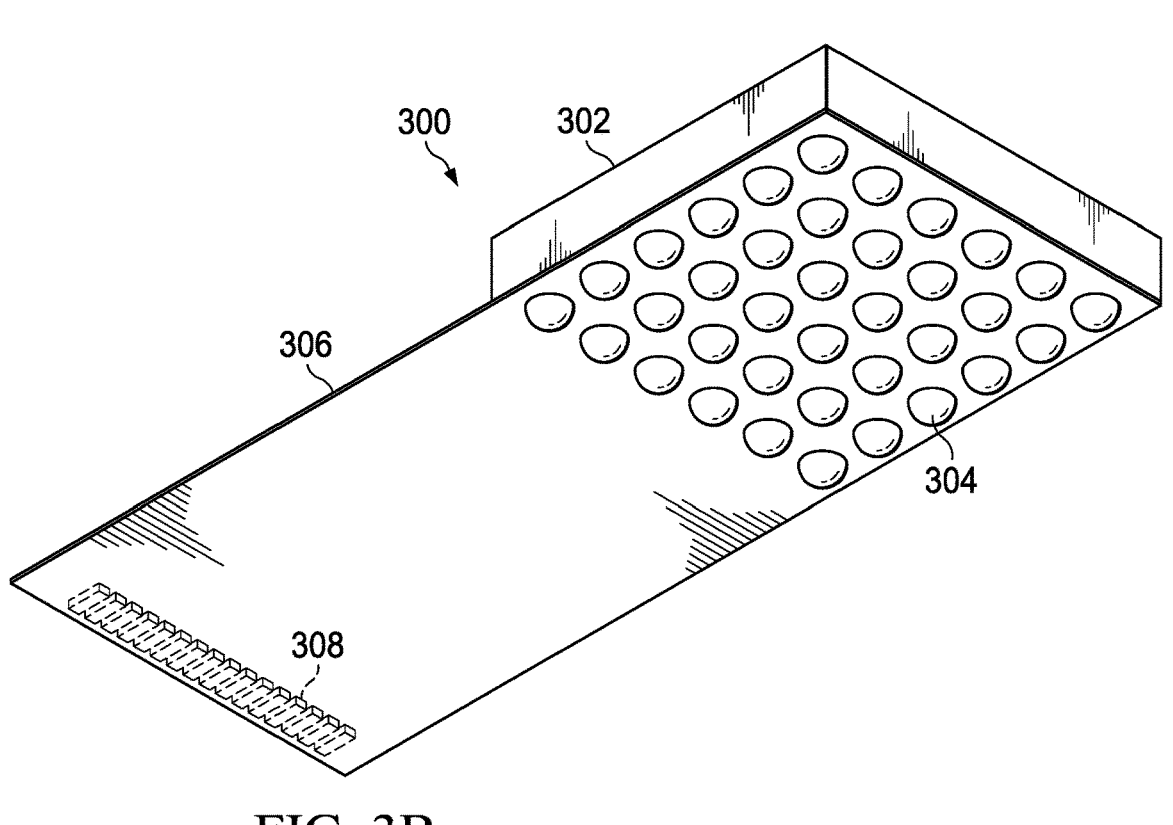
FIG. 3B is a perspective bottom view of a semiconductor package having a flexible substrate that is partially not covered by a mold compound, in accordance with various examples.
Figures 3C, 3D:
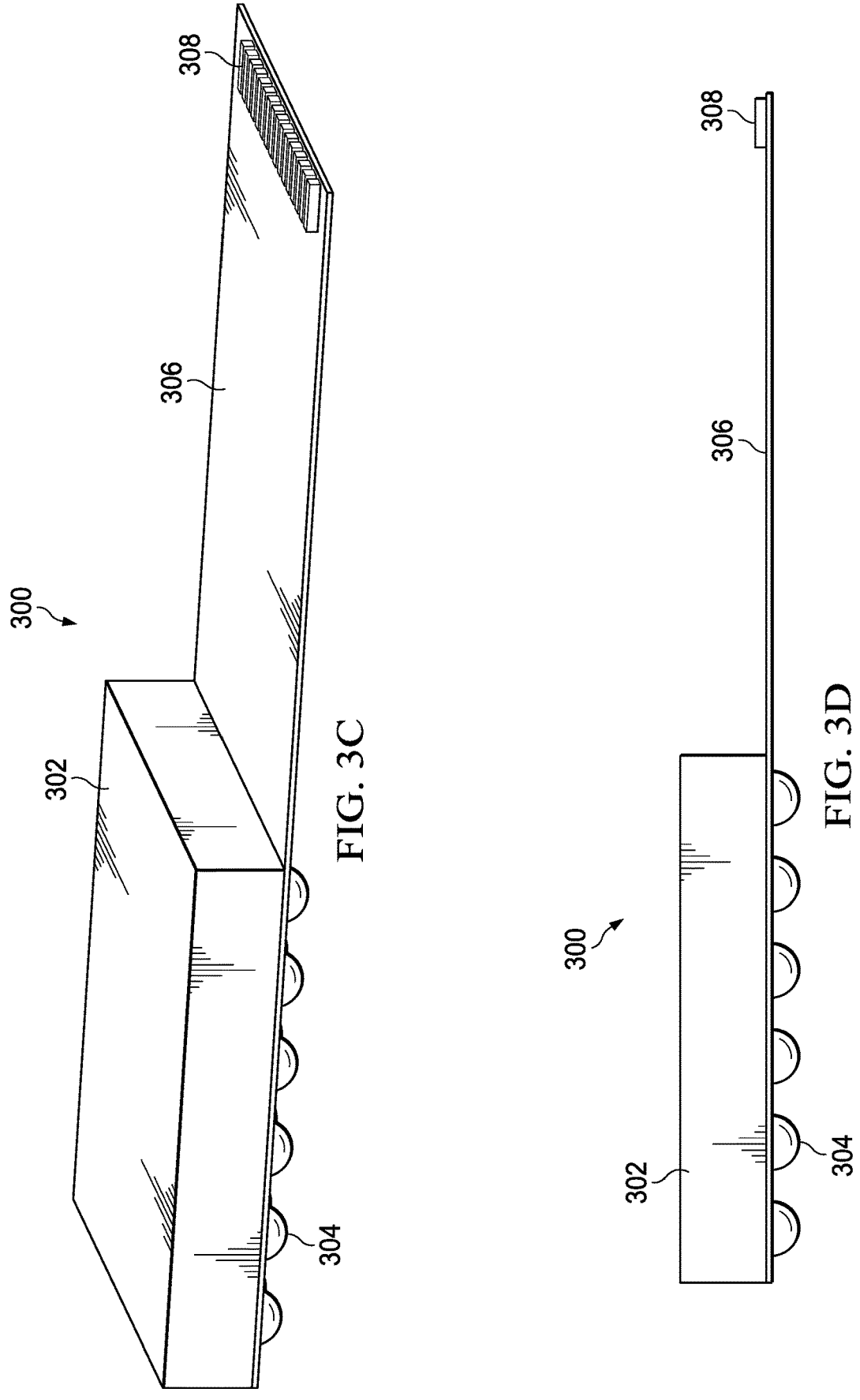
FIG. 3C is a perspective top view of a semiconductor package having a flexible substrate that is partially not covered by a mold compound, in accordance with various examples.
FIG. 3D is a profile view of a semiconductor package having a flexible substrate that is partially not covered by a mold compound, in accordance with various examples.

FIG. 3B is a perspective bottom view of the semiconductor package 300, in accordance with various examples. FIG. 3C is another perspective top view of the semiconductor package 300, in accordance with various examples. FIG. 3D is a profile view of the semiconductor package 300, in accordance with various examples.

Figures 3E, 3F:
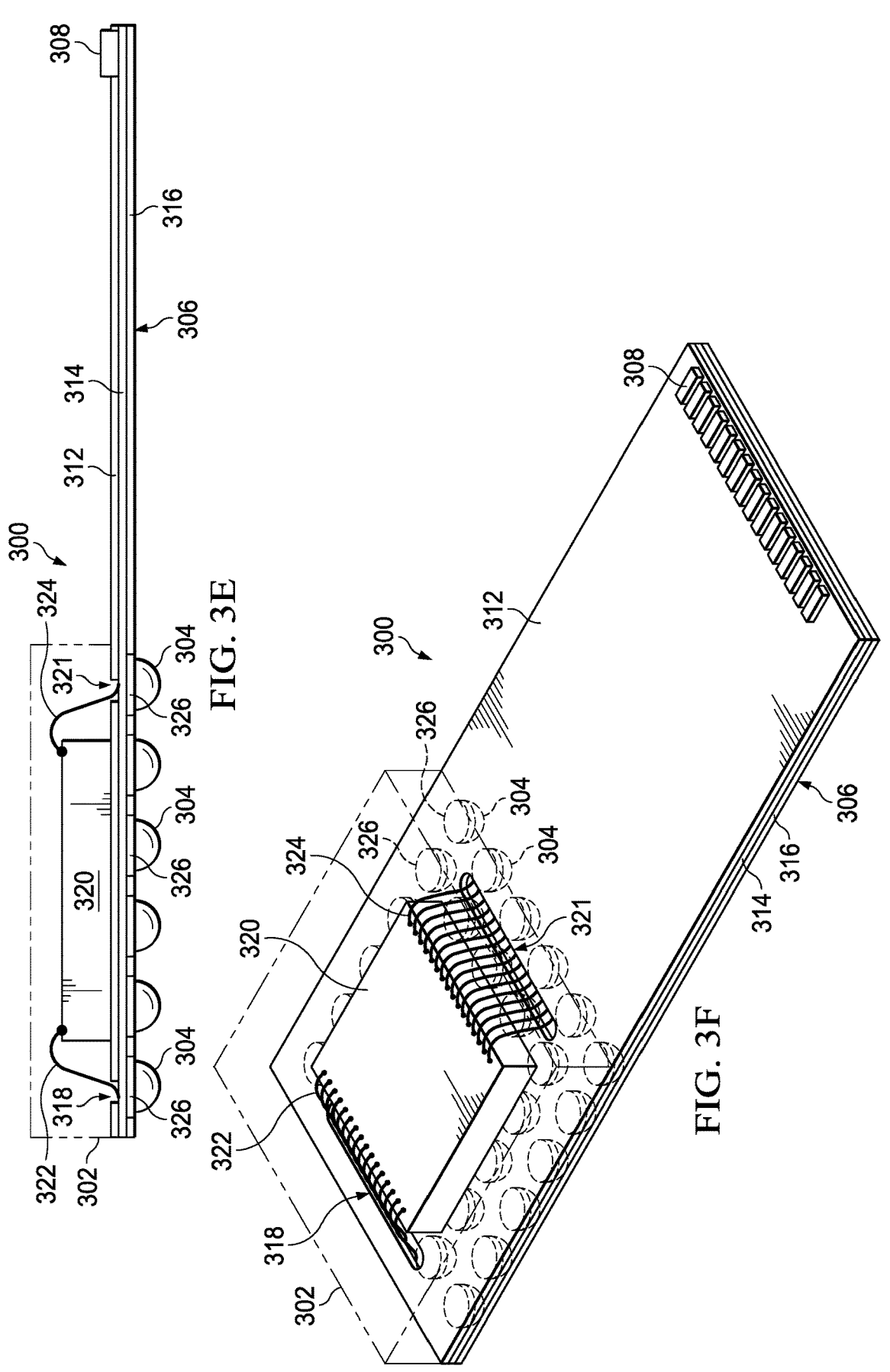
FIG. 3E is a partially transparent profile view of a semiconductor package having a flexible substrate that is partially not covered by a mold compound, in accordance with various examples.
FIG. 3F is a partially transparent perspective view of a semiconductor package having a flexible substrate that is partially not covered by a mold compound, in accordance with various examples.

FIG. 3E is a partially transparent profile view of the semiconductor package 300, in accordance with various examples. The flexible substrate 306 includes a protective, insulative layer 312, such as a solder resist, on a top surface of the flexible substrate 306. The flexible substrate 306 includes at least one conductive layer 314, although multiple such layers may be used to form a network of conductive traces within the flexible substrate 306. An insulative layer 316 (e.g., polyimide) abuts the conductive layer 314. Orifices 326 in the insulative layer 316 connect the conductive layer 314 to conductive members 304, as shown. The mold compound 302 covers a semiconductor die 320 having a device side with circuitry formed therein. The device side of the semiconductor die 320 couples to the conductive layer 314 by way of bond wires 322, 324 through orifices 318, 321, respectively. The conductive layer 314 also is coupled to the conductive terminals 308 on a distal end of the flexible substrate 306, as shown. In this way, the conductive terminals 308, the semiconductor die 320, and the conductive members 304 are electrically coupled to each other by way of the conductive layer 314. FIG. 3F is a perspective view of the structure of FIG. 3E.

Figure 3G:
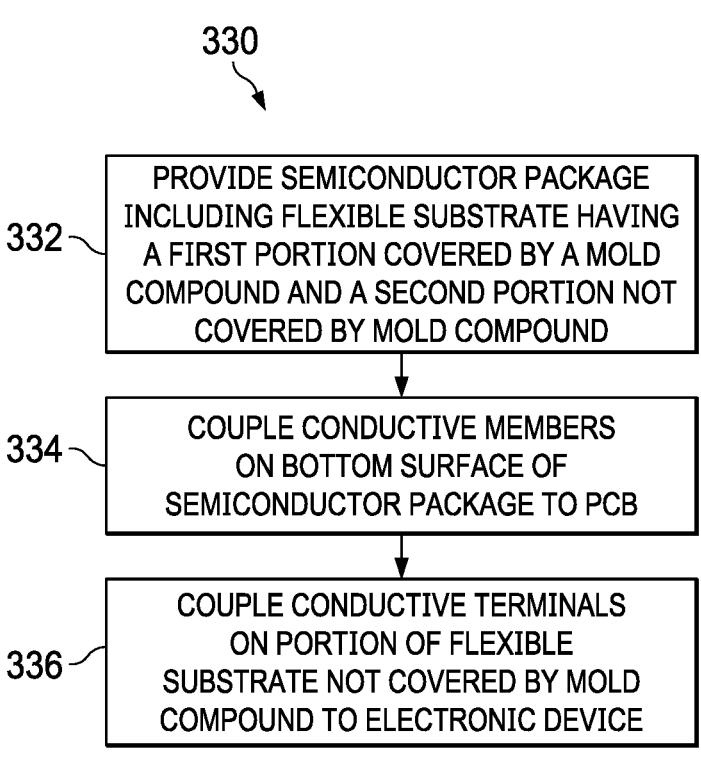
FIG. 3G is a flow diagram of a method for manufacturing a semiconductor package having a flexible substrate that is partially not covered by a mold compound, in accordance with various examples.

FIG. 3G is a flow diagram of a method 330 for manufacturing a semiconductor package having a flexible substrate that is partially not covered by a mold compound, in accordance with various examples. The method 330 includes providing a semiconductor package (e.g., semiconductor package 300, FIG. 3A) including a flexible substrate (e.g., flexible substrate 306, FIG. 3A) having a first portion covered by a mold compound (e.g., mold compound 302, FIG. 3A) and a second portion not covered by the mold compound (332). The method 330 includes coupling conductive members (e.g., conductive members 304, FIG. 3A) on a bottom surface of the semiconductor package to a PCB (334). The method 330 includes coupling conductive terminals (e.g., conductive terminals 308, FIG. 3A) on the portion of the flexible substrate not covered by the mold compound to an electronic device (336). The order in which the steps of the method 330 are performed may be adjusted to achieve any suitable sequence, and all such permutations are encompassed in the scope of this disclosure.

Figure 3H:
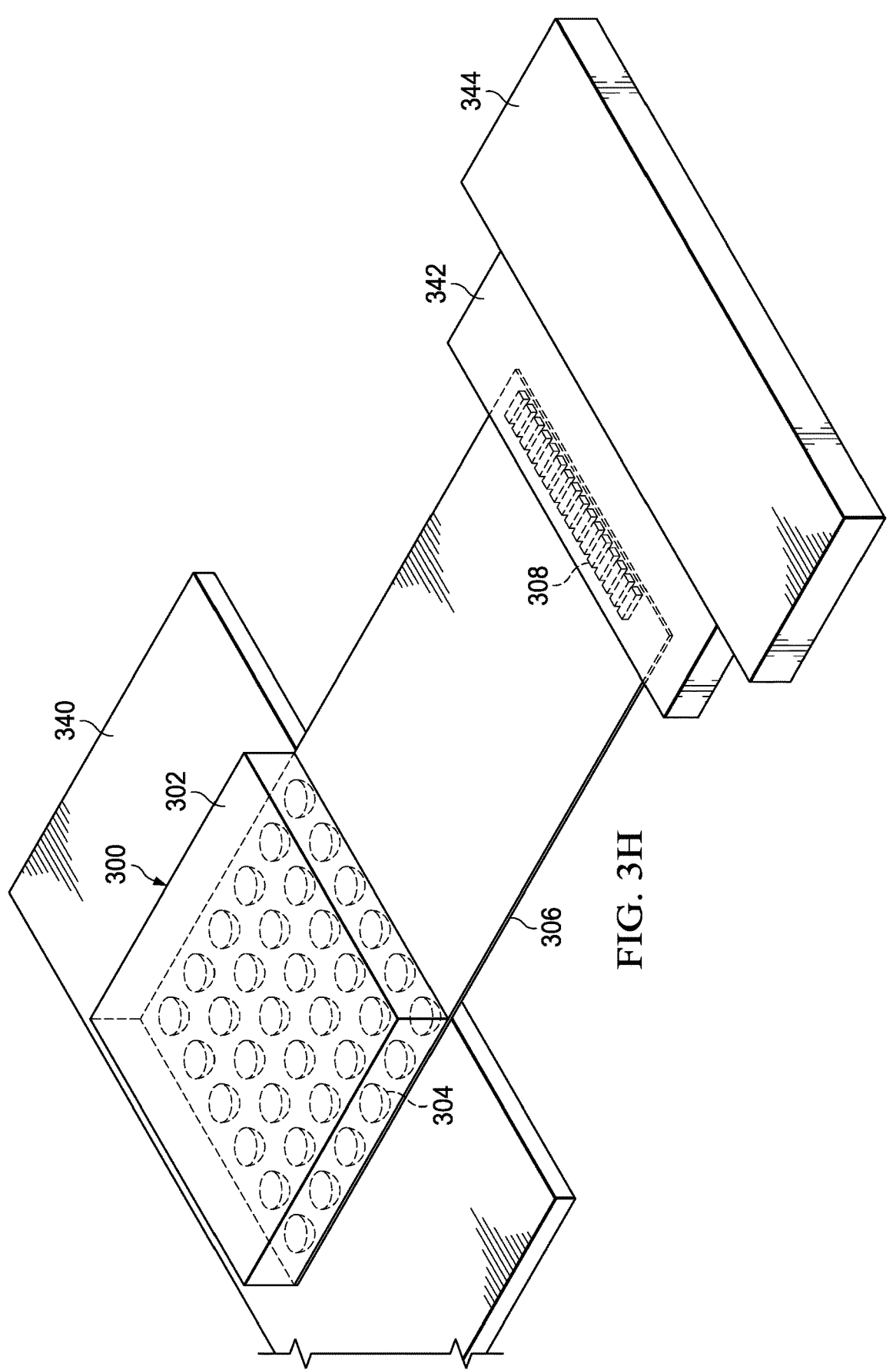
FIG. 3H is a perspective view of a semiconductor package coupled to a PCB, and an exposed portion of a flexible substrate coupled to a connector of an electronic component using conductive terminals, in accordance with various examples.

FIG. 3H is a perspective view of the semiconductor package 300 coupled to a PCB 340, and the exposed portion of the flexible substrate 306 coupled to a connector 342 of an electronic component 344 using conductive terminals 308 (FIG. 3D), in accordance with various examples. For instance, the electronic component 344 may be a pixel array of a digital x-ray machine, and the connector 342 may be a ZIF connector or another suitable type of connector. The scope of this disclosure is not limited to an electronic component 344 that is a digital x-ray machine, and a variety of components may be used instead of a pixel array of a digital x-ray machine. In some examples, the connector 342 may be omitted, and the conductive terminals 308 of the flexible substrate 306 may couple to the electronic component 344 through another structure, such as an ACF, a solder reflow process, etc. Still other coupling techniques are contemplated.

Figure 4A:
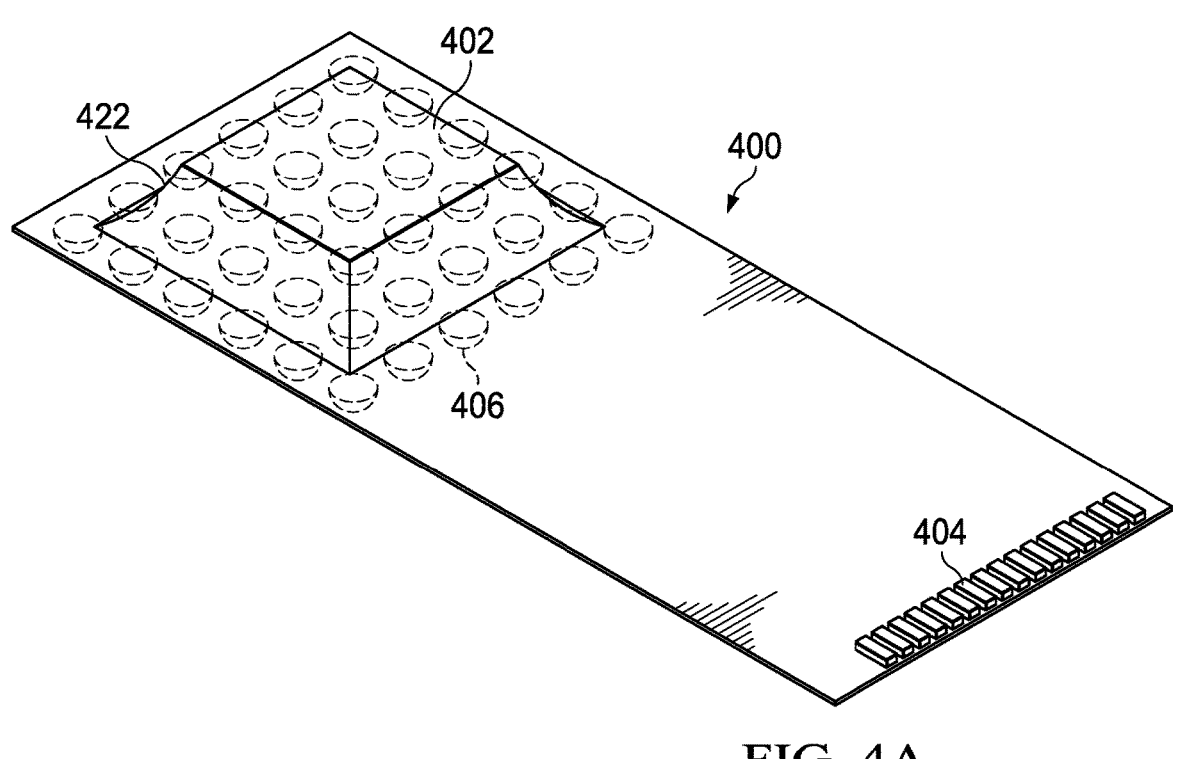
FIG. 4A is a perspective top view of a semiconductor die coupled to a flexible substrate, in accordance with various examples.
Figure 4B:
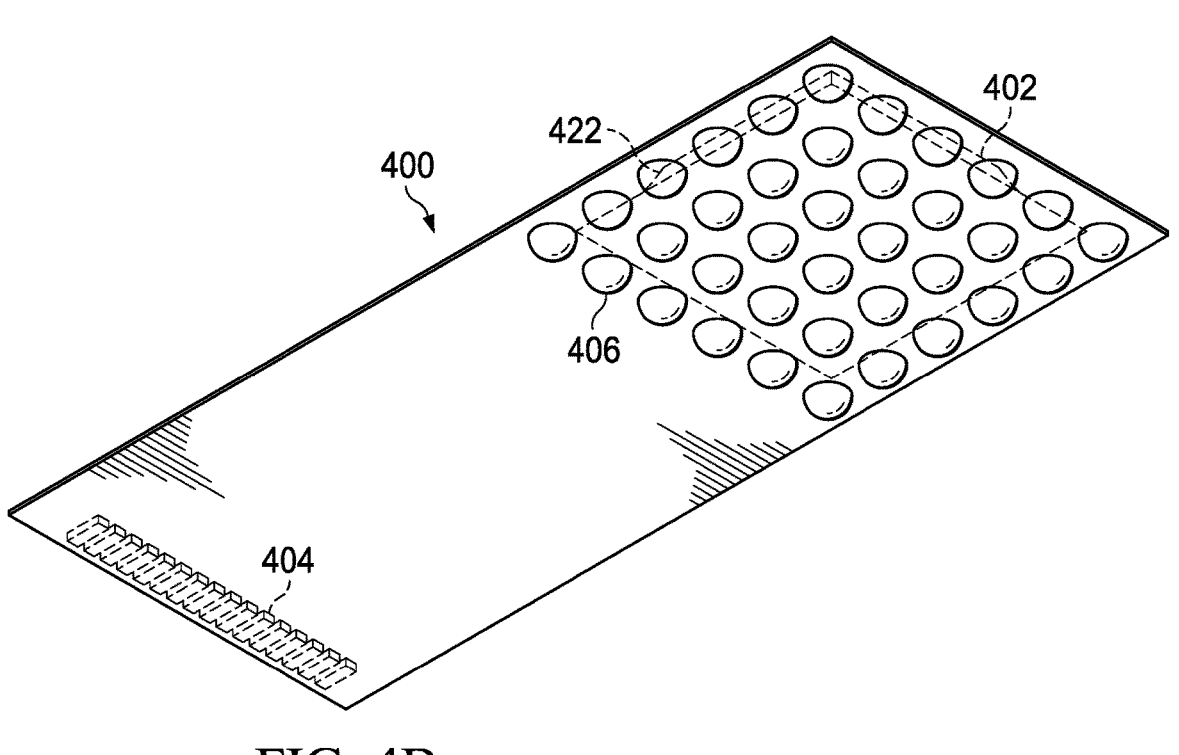
FIG. 4B is a perspective bottom view of a semiconductor die coupled to a flexible substrate, in accordance with various examples.
Figures 4C, 4D:
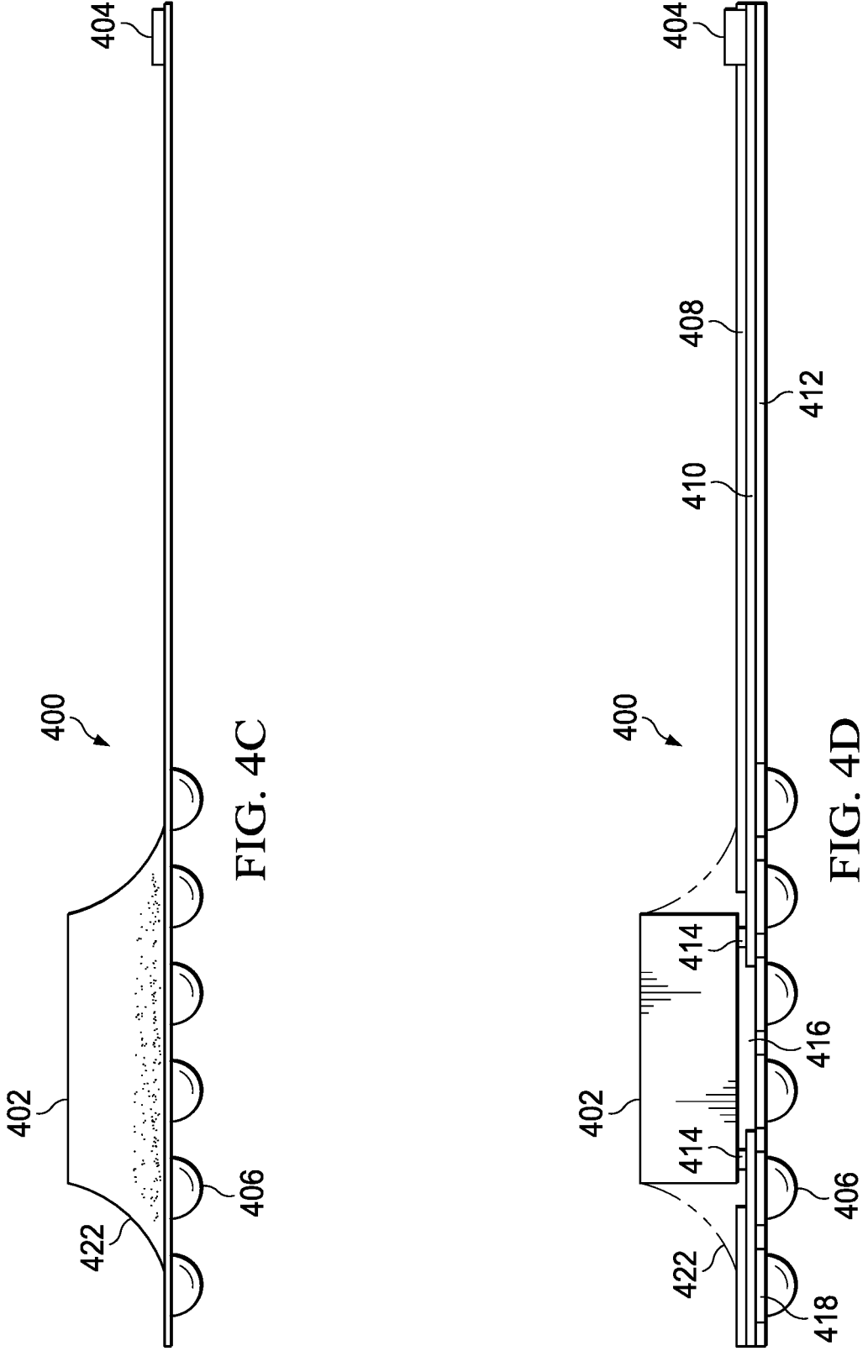
FIG. 4C is a profile view of a semiconductor die coupled to a flexible substrate, in accordance with various examples.
FIG. 4D is a partially transparent profile view of a semiconductor die coupled to a flexible substrate, in accordance with various examples.

FIG. 4A is a perspective top view of a semiconductor die 402 coupled to a flexible substrate 400, in accordance with various examples. More specifically, the flexible substrate 400 includes openings in a top layer, such as a solder resist layer, through which a device side of the semiconductor die 402 is coupled to a conductive layer including conductive traces within the flexible substrate 400. Because the device side of the semiconductor die 402 faces the flexible substrate 400, the semiconductor die 402 may be referred to as having a "flip chip" orientation. The conductive layer within the flexible substrate 400 is coupled to conductive members (e.g., solder balls) 406 and to conductive terminals 404 at a distal end of the flexible substrate 400. FIG. 4B is a perspective bottom view of the structure of FIG. 4A, in accordance with various examples. FIG. 4C is a profile view of the structure of FIG. 4A, in accordance with various examples.

Figures 4E, 4F:
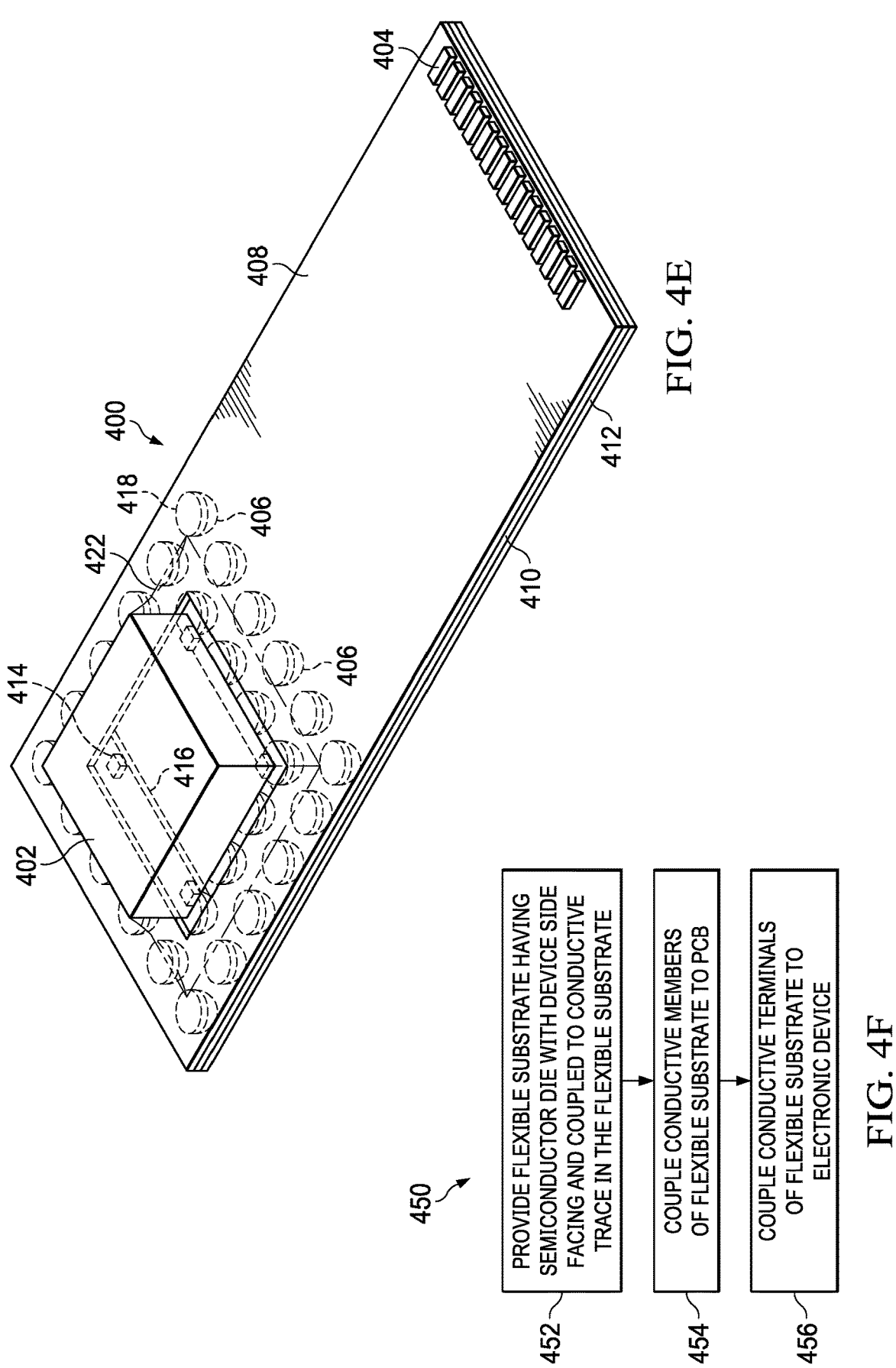
FIG. 4E is a partially transparent perspective view of a semiconductor die coupled to a flexible substrate, in accordance with various examples.
FIG. 4F is a flow diagram of a method for manufacturing a semiconductor die coupled to a flexible substrate, in accordance with various examples.

FIG. 4D is a partially transparent profile view of the structure of FIG. 4A, in accordance with various examples. As shown, the flexible substrate 400 includes a protective, insulative layer 408, such as a solder resist. A conductive layer 410 abuts the protective, insulative layer 408, and an insulative layer 412 (e.g., a polyimide layer) abuts the conductive layer 410. The device side of the semiconductor die 402 couples to the conductive layer 410 by way of solder balls 414. The portions of the conductive layer 410 to which the solder balls 414 couple are separated by a gap 416 to avoid shorting the solder balls 414. Orifices 418 in the insulative layer 412 facilitate connections between the conductive layer 410 and the conductive members 406. The conductive layer 410 is also coupled to the conductive terminals 404. Thus, the conductive layer 410 couples the conductive terminals 404, the conductive members 406, and the semiconductor die 402 to each other. An underfill 422 is provided to protect the connections of and the device side of the semiconductor die 402. FIG. 4E is a perspective view of the structure of FIG. 4D, in accordance with various examples.

FIG. 4F is a flow diagram of a method 450 for manufacturing a semiconductor die coupled to a flexible substrate, in accordance with various examples. The method 450 includes providing a flexible substrate (e.g., flexible substrate 400, FIG. 4A) having a semiconductor die (e.g., semiconductor die 402, FIG. 4A) with a device side facing and coupled to a conductive trace (e.g., in the conductive layer 410, FIG. 4D) in the flexible substrate (452). The method 450 includes coupling the conductive members of the flexible substrate (e.g., conductive members 406, FIG. 4D) to a PCB (454). The method 450 includes coupling the conductive terminals of the flexible substrate (e.g., conductive terminals 404, FIG. 4D) to an electronic device (456). The order in which the steps of the method 450 are performed may be adjusted to achieve any suitable sequence, and all such permutations are encompassed in the scope of this disclosure.

Figure 4G:
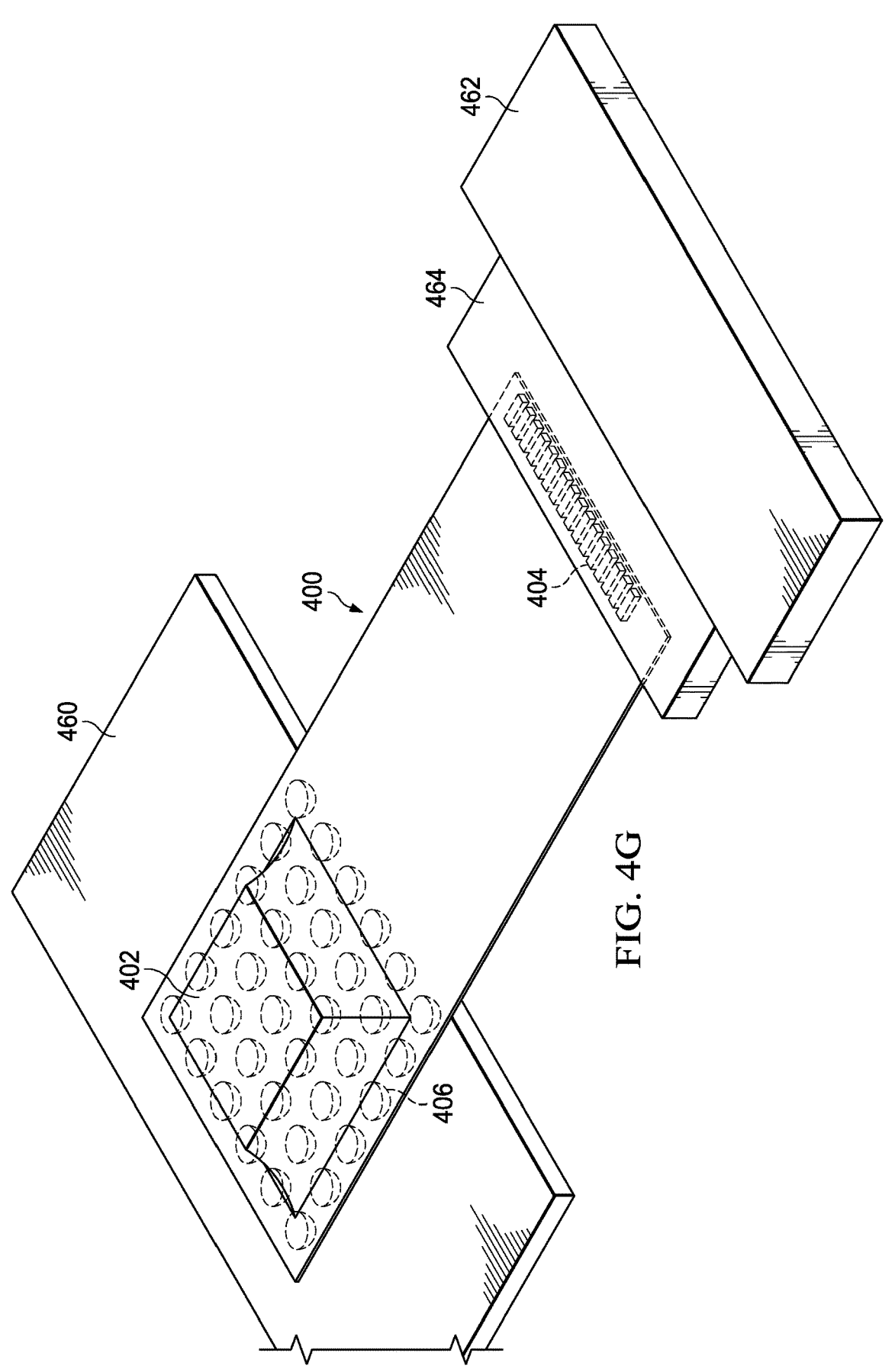
FIG. 4G is a perspective view of conductive members of a flexible substrate coupled to a PCB and conductive terminals of the flexible substrate coupled to an electronic component by way of a connector, in accordance with various examples.

FIG. 4G is a perspective view of the conductive members 406 of the flexible substrate 400 coupled to a PCB 460 and the conductive terminals 404 of the flexible substrate 400 coupled to an electronic component 462 by way of a connector 464, in accordance with various examples. For instance, the electronic component 462 may be a pixel array of a digital x-ray machine, and the connector 464 may be a ZIF connector or another suitable type of connector. The scope of this disclosure is not limited to an electronic component 462 that is a digital x-ray machine, and a variety of components may be used instead of a pixel array of a digital x-ray machine. In some examples, the connector 464 may be omitted, and the conductive terminals 404 of the flexible substrate 400 may couple to the electronic component 462 through another structure, such as an ACF, a solder reflow process, etc. Still other coupling techniques are contemplated.

Figure 5:
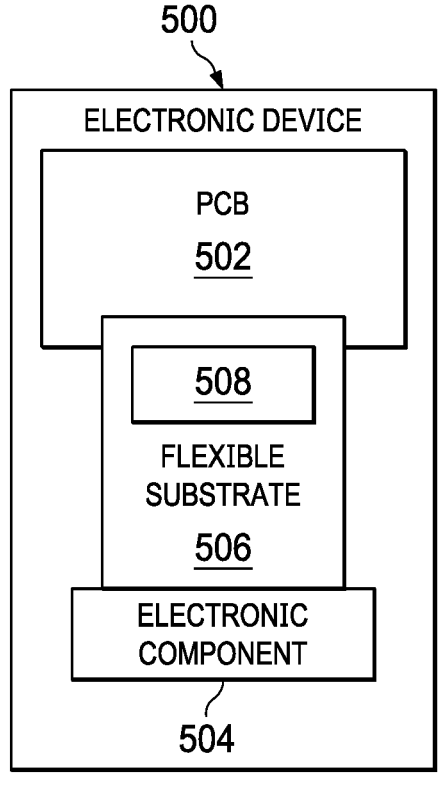
FIG. 5 is a block diagram of an electronic device comprising a flexible substrate coupled to a semiconductor package and to an electronic component of the electronic device, in accordance with various examples.

FIG. 5 is a block diagram of an electronic device 500, in accordance with various examples. The electronic device 500 may be a personal electronic device (e.g., smartphones, laptop computers, desktop computers, tablets, notebooks, artificial intelligence assistants), an electronic appliance (e.g., refrigerators, microwave ovens, toaster ovens, dishwashers), a networking or enterprise-level electronic device or system (e.g., servers, routers, modems, mainframe computers, wireless access points), an automobile or aviation device or system (e.g., control panels, entertainment devices, navigation devices, power electronics), or any of a variety of other electronic devices or systems. In examples, the electronic device 500 is an imaging device, such as a digital x-ray machine. The electronic device 500 includes a PCB 502, an electronic component 504 (e.g., a pixel array), a flexible substrate 506, and a semiconductor die or package 508. The semiconductor die or package 508 includes conductive members (e.g., solder balls) on a bottom surface thereof with which the semiconductor die or package 508 is coupled to the PCB 502. In examples, the flexible substrate 506 is coupled to a rigid substrate within the semiconductor die or package 508, as described above. In examples, the flexible substrate 506 is within and part of the semiconductor die or package 508, as described above. Any suitable connection technique is useful to couple the flexible substrate 506 to the semiconductor die or package 508, including ACF, solder reflow processes, etc. The flexible substrate 506 may be coupled to the electronic component 504 using any suitable connection technique, such as ACF, solder reflow processes, connectors, etc. In an example operation, the electronic component 504 may include a pixel array that is coupled to a flat panel x-ray detector to detect light signals, such as x-rays. The pixel array converts the x-ray signals to charges, and the semiconductor die or package 508 is configured to convert the charges to digital signals for subsequent use (e.g., to form x-ray images).

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Unless otherwise stated, "about," "approximately," or "substantially" preceding a value means+/−10 percent of the stated value. Modifications are possible in the described examples, and other examples are possible within the scope of the claims.

What is claimed is:
1. An electronic device, comprising:
   a semiconductor package including:
      a semiconductor die;

a set of conductive members coupled to the semiconductor die, the set of conductive members coupled to a bottom surface of the semiconductor package; and a conductive terminal coupled to the semiconductor die and exposed to the bottom surface, the set of conductive members extending farther away from the bottom surface of the semiconductor package than the conductive terminal extends from the bottom surface of the semiconductor package; and a flexible substrate having first and second ends opposing each other, the first end having a first conductive terminal coupled to the conductive terminal, the second end having a second conductive terminal adapted to be coupled to an electronic component, the first and second conductive terminals coupled to each other, wherein the flexible substrate has a bottom surface that does not extend farther away from the bottom surface of the semiconductor package than the set of conductive members extends from the bottom surface of the semiconductor package.

2. The electronic device of claim 1, wherein the semiconductor package is a ball grid array (BGA) package.

3. The electronic device of claim 1, further comprising a printed circuit board (PCB) coupled to the set of conductive members.

4. The electronic device of claim 1, further comprising an array of pixels configured to convert a light signal to a charge, wherein the semiconductor die is configured to convert the charge to a digital signal.

5. The electronic device of claim 4, wherein the light signal is an x-ray signal.

6. The electronic device of claim 1, wherein the conductive terminal is coupled to the first conductive terminal by reflowed solder.

7. The electronic device of claim 1, wherein the conductive terminal is coupled to the first conductive terminal by anisotropic conductive film.

8. The electronic device of claim 1, wherein the semiconductor package includes a set of conductive terminals including the conductive terminal, and wherein the flexible substrate includes a set of first conductive terminals including the first conductive terminal, the set of conductive terminals and the set of first conductive terminals being identical in number.

9. An electronic device, comprising:

a ball grid array (BGA) semiconductor package including:

a semiconductor die;

a plurality of conductive balls coupled to the semiconductor die, the plurality of conductive balls coupled to a bottom surface of the BGA semiconductor package; and a conductive terminal, where no conductive ball is formed, coupled to the semiconductor die and exposed to the bottom surface, the plurality of conductive balls extending farther away from the bottom surface of the BGA semiconductor package than the conductive terminal extends from the bottom surface of the BGA semiconductor package; and a flexible substrate having first and second ends opposing each other, the first end having a first conductive terminal coupled to the conductive terminal, the second end having a second conductive terminal adapted to be coupled to an electronic component, the first and second conductive terminals of the flexible substrate coupled to each other, wherein the flexible substrate has a bottom surface that does not extend farther away from the bottom surface of the BGA semiconductor package than the plurality of conductive balls extends from the bottom surface of the BGA semiconductor package.

10. The electronic device of claim 9, further comprising a printed circuit board (PCB) coupled to the plurality of conductive balls.

11. The electronic device of claim 9, further comprising an array of pixels configured to convert a light signal to a charge, wherein the semiconductor die is configured to convert the charge to a digital signal.

12. The electronic device of claim 11, wherein the light signal is an x-ray signal.

13. The electronic device of claim 9, wherein the conductive terminal of the BGA semiconductor package is coupled to the first conductive terminal of the flexible substrate by solder.

14. The electronic device of claim 9, wherein the conductive terminal of the BGA semiconductor package is coupled to the first conductive terminal of the flexible substrate by anisotropic conductive film.

15. The electronic device of claim 9, wherein the BGA semiconductor package includes a set of conductive terminals including the conductive terminal, and wherein the flexible substrate includes a set of first conductive terminals including the first conductive terminal, the set of conductive terminals of the BGA semiconductor package and the set of first conductive terminals of the flexible substrate being identical in number.

16. An electronic device, comprising:

a ball grid array (BGA) semiconductor package including:

a semiconductor die electrically coupled to a plurality of conductive balls and a plurality of conductive terminals; and mold compound covering the semiconductor die, the plurality of conductive balls and the plurality of conductive terminals physically contacting a surface of the mold compound, a height of each of the plurality of conductive balls greater than a height of each of the plurality of conductive terminals; and a substrate including a plurality of terminals, each of the plurality of terminals attached to a corresponding one of the plurality of conductive terminals.

17. The electronic device of claim 16, wherein the plurality of conductive terminals is proximate to a periphery of the BGA semiconductor package.

18. An electronic device, comprising:

a semiconductor package including:

a semiconductor die;

a conductive ball electrically connected to the semiconductor die, the conductive ball physically contacting and extending from a bottom surface of the semiconductor package at a first height; and a conductive terminal electrically connected to the semiconductor die, the conductive terminal physically contacting and extending from the bottom surface of the semiconductor package at a second height; and a substrate including a first end and a second end, the first end including a first conductive terminal coupled to the conductive terminal of the semiconductor package, and the second end including a second conductive terminal adapted to be coupled to an electronic component, wherein a thickness of the substrate is less than the first height.

19. The electronic device of claim 18, wherein the second height is less than the first height.

20. The electronic device of claim 18, wherein the semiconductor package is a ball grid array (BGA) package.

21. The electronic device of claim 18, wherein the conductive terminal is rectangular in shape.

* * * * *